US012757528B2

(12) United States Patent
Akatsuka

(10) Patent No.: US 12,757,528 B2
(45) Date of Patent: Oct. 6, 2026

(54) LIGHT-EMITTING DEVICE, DISPLAY DEVICE, AND ELECTRONIC APPARATUS

(71) Applicant: SEIKO EPSON CORPORATION, Tokyo (JP)

(72) Inventor: Yasuto Akatsuka, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 377 days.

(21) Appl. No.: 18/604,725

(22) Filed: Mar. 14, 2024

(65) Prior Publication Data

US 2024/0313158 A1 Sep. 19, 2024

(30) Foreign Application Priority Data

Mar. 15, 2023 (JP) ................................ 2023-040513

(51) Int. Cl.

*H10H 20/821* (2025.01)
*H10H 20/831* (2025.01)
*H10H 20/855* (2025.01)
*H10W 90/00* (2026.01)

(52) U.S. Cl.

CPC ........ *H10H 20/821* (2025.01); *H10H 20/831* (2025.01); *H10H 20/855* (2025.01); *H10W 90/00* (2026.01)

(58) Field of Classification Search

CPC .. H10H 20/821; H10H 20/831; H10H 20/833; H10H 20/855; H10W 90/00; H01L 33/24; H01L 33/38; H01L 33/58; H01L 25/075; H01L 25/0753

See application file for complete search history.

(56) References Cited

U.S. PATENT DOCUMENTS

| | | | | |
|---|---|---|---|---|
| 2020/0251460 A1* | 8/2020 | Iguchi | .................. | H10H 29/142 |
| 2021/0167247 A1* | 6/2021 | Okumura | ............. | H10H 20/818 |
| 2023/0187591 A1* | 6/2023 | Tan | ...................... | H10H 20/825 257/79 |
| 2024/0313148 A1* | 9/2024 | Kreiner | ................ | H10H 20/833 |
| 2024/0313159 A1* | 9/2024 | Akatsuka | ............ | H10H 20/821 |

FOREIGN PATENT DOCUMENTS

| | | |
|---|---|---|
| JP | 2021-086929 A | 6/2021 |
| WO | 2019/038961 A1 | 2/2019 |

* cited by examiner

*Primary Examiner* — Earl N Taylor
(74) *Attorney, Agent, or Firm* — Oliff PLC

(57) ABSTRACT

A light-emitting device includes a stacked body that includes a tapered portion having a tapered shape having a width increasing from side of a first electrode toward side of a second electrode, a first low refractive index portion that is provided on a side surface of the tapered portion, a second low refractive index portion that is provided on side of the second electrode opposite to the stacked body, and a metal portion provided on a side surface of the second low refractive index portion, wherein the stacked body includes a first semiconductor layer, a second semiconductor layer, and a light-emitting layer, light generated in the light-emitting layer is emitted from the side of the second electrode, and a surface of the second low refractive index portion on side opposite to the second electrode is a lens surface.

9 Claims, 19 Drawing Sheets

LIGHT-EMITTING DEVICE, DISPLAY DEVICE, AND ELECTRONIC APPARATUS

The present application is based on, and claims priority from JP Application Serial Number 2023-040513, filed Mar. 15, 2023, the disclosure of which is hereby incorporated by reference herein in its entirety.

BACKGROUND

1. Technical Field

The present disclosure relates to a light-emitting device, a display device, and an electronic apparatus.

2. Related Art

A light-emitting element such as a light emitting diode (LED) is applied to a light source of a display device and the like.

For example, WO 2019/038961 describes a micro LED element including a nitride semiconductor layer in which an N-type layer, a light-emitting layer, and a P-type layer are stacked in this order as viewed from a light emission surface side, a P-side electrode layer formed on the P-type layer, and an N-side electrode layer stacked on the light emission surface.

Improvement in light extraction efficiency of the micro LED element as described above has been desired.

SUMMARY

A light-emitting device according to one aspect of the present disclosure includes a first electrode, a second electrode that is disposed to face the first electrode and has a light-transmitting property, a stacked body that is provided between the first electrode and the second electrode and includes a tapered portion having a tapered shape having a width increasing from a side of the first electrode toward a side of the second electrode, a first low refractive index portion that is provided on a side surface of the tapered portion and has a lower refractive index than the stacked body, a second low refractive index portion that is provided on a side of the second electrode opposite to the stacked body and has a lower refractive index than the stacked body, and a metal portion provided on a side surface of the second low refractive index portion, wherein the stacked body includes a first semiconductor layer of a first conductivity type, a second semiconductor layer of a second conductivity type different from the first conductivity type that is provided between the first semiconductor layer and the second electrode, and a light-emitting layer that is provided between the first semiconductor layer and the second semiconductor layer, light generated in the light-emitting layer is emitted from the side of the second electrode, and a surface of the second low refractive index portion on a side opposite to the second electrode is a lens surface.

A display device according to one aspect of the present disclosure includes the light-emitting device according to one aspect.

An electronic apparatus according to one aspect of the present disclosure includes the light-emitting device according to one aspect.

DESCRIPTION OF EMBODIMENTS

A preferred embodiment of the present disclosure will be described in detail below with reference to the drawings. Note that the embodiment described below does not unduly limit the content of the present disclosure described in the claims. In addition, not all the configurations described below are essential constituent elements of the present disclosure.

1. LIGHT-EMITTING DEVICE

1.1. Configuration

Figure 1:
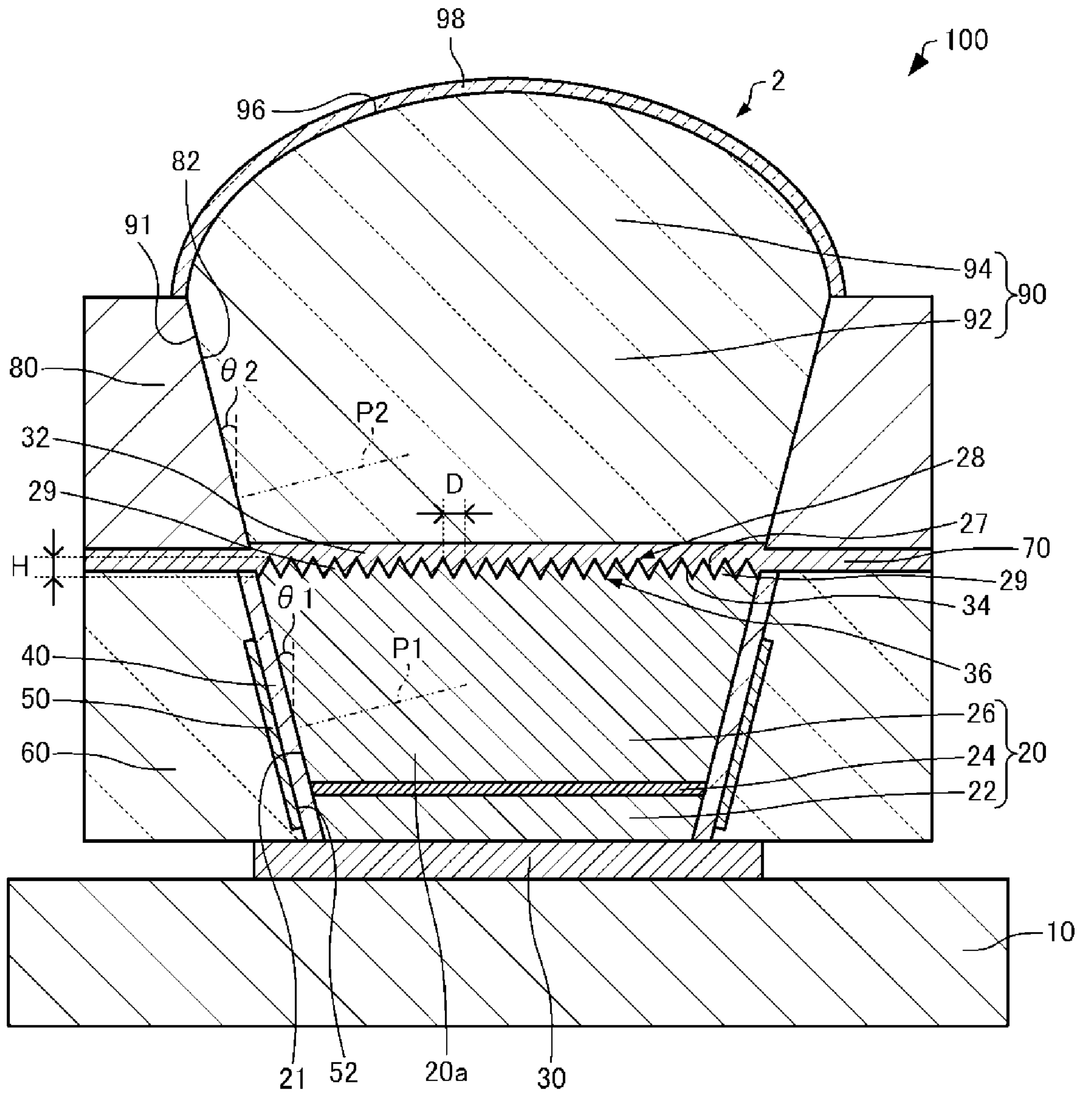
FIG. 1 is a cross-sectional view schematically illustrating a light-emitting device according to the present embodiment.

First, a light-emitting device according to the present embodiment will be described with reference to the drawings. FIG. 1 is a cross-sectional view schematically illustrating a light-emitting device 100 according to the present embodiment.

As illustrated in FIG. 1, the light-emitting device 100 includes, for example, a substrate 10, a stacked body 20, a first electrode 30, a second electrode 32, a first light-transmitting portion 40, a first metal layer 50, an insulating portion 60, a wiring layer 70, a metal portion 80, a second light-transmitting portion 90, and a light-transmitting layer 98. The stacked body 20, the first electrode 30, the second electrode 32, the first light-transmitting portion 40, the first metal layer 50, the second light-transmitting portion 90, and the light-transmitting layer 98 constitute a light-emitting element 2. The light-emitting element 2 is an LED for example. The light-emitting element 2 may be a semiconductor laser.

The substrate 10 is, for example, a silicon substrate. The substrate 10 may be provided with a driving circuit for driving the light-emitting element 2.

The light-emitting element 2 is mounted on the substrate 10. The light-emitting element 2 is junction-down mounted. Although not elaborated in the figures, a plurality of the light-emitting elements 2 may be provided. As viewed in a direction in which a first semiconductor layer 22 and a light-emitting layer 24 of the stacked body 20 are stacked (hereinafter, may be simply referred to as "stacking direction"), the plurality of light-emitting elements 2 may be arranged in a matrix.

The stacked body 20 is provided between the first electrode 30 and the second electrode 32. In the illustrated example, the stacked body 20 is provided on the first electrode 30. The stacked body 20 includes a tapered portion 20*a* having a tapered shape that becomes wider from the first electrode 30 side toward the second electrode 32 side. The width of the tapered portion 20*a* gradually increases from the first electrode 30 side toward the second electrode 32 side. In the illustrated example, the tapered portion 20*a* has a trapezoidal shape. The width is a size in a direction orthogonal to the stacking direction. In a cross-sectional view taken along the stacking direction and a direction orthogonal to the stacking direction and passing through the center of the stacked body 20 in plan view in the stacking direction, the width is the size in the direction orthogonal to the stacking direction. A side surface 21 of the tapered portion 20*a* is inclined with respect to the stacking direction. An inclination angle θ1 of the side surface 21 with respect to the stacking direction is, for example, 20° or more and 30° or less. The side surface 21 of the tapered portion 20*a* constitutes a side surface of the stacked body 20.

In the present specification, the description will be given with the stacking direction based on the light-emitting layer 24, that is, with a direction from the light-emitting layer 24 toward a second semiconductor layer 26 of the stacked body 20 defined as "upward", and a direction from the light-emitting layer 24 toward the first semiconductor layer 22 defined as "downward".

The stacked body 20 includes the first semiconductor layer 22, the light-emitting layer 24, and the second semiconductor layer 26. The first semiconductor layer 22, the light-emitting layer 24, and the second semiconductor layer 26 constitute the tapered portion 20*a*. The first semiconductor layer 22, the light-emitting layer 24, and the second semiconductor layer 26 are, for example, a group III nitride semiconductor and have a wurtzite crystal structure.

The first semiconductor layer 22 is provided on the first electrode 30. In the illustrated example, the first semiconductor layer 22 is in contact with the first electrode 30. The first semiconductor layer 22 is provided between the first electrode 30 and the light-emitting layer 24. The first semiconductor layer 22 is provided between the first electrode 30 and the second electrode 32. The first semiconductor layer 22 is of a first conductivity type. The first semiconductor layer 22 is, for example, a p-type GaN layer doped with Mg.

The light-emitting layer 24 is provided on the first semiconductor layer 22. The light-emitting layer 24 is provided between the first semiconductor layer 22 and the second semiconductor layer 26. In the illustrated example, the light-emitting layer 24 constitutes the side surface 21 of the tapered portion 20*a*. The first semiconductor layer 22, the light-emitting layer 24, and the second semiconductor layer 26 constitute the side surface 21. Although not elaborated in the figures, the light-emitting layer 24 may be separated from the side surface 21. The width of the light-emitting layer 24 is, for example, 3 μm or less.

The light-emitting layer 24 is of an i-type conductivity type in which no impurity is intentionally doped. The light-emitting layer 24 generates light when an electric current is injected thereinto. The light-emitting layer 24 has, for example, a well layer and a barrier layer. The well layer and the barrier layer are i-type semiconductor layers. The well layer is an InGaN layer, for example. The barrier layer is a GaN layer, for example. The light-emitting layer 24 has a multiple quantum well (MQW) structure configured of the well layer and the barrier layer.

Also, the number of well layers and barrier layers forming the light-emitting layer 24 is not particularly limited. For example, only one well layer may be provided, and in this case, the light-emitting layer 24 has a single quantum well (SQW) structure.

The second semiconductor layer 26 is provided on the light-emitting layer 24. The second semiconductor layer 26 is provided between the light-emitting layer 24 and the second electrode 32. The second semiconductor layer 26 is provided between the first semiconductor layer 22 and the second electrode 32. In the illustrated example, the size of the second semiconductor layer 26 in the stacking direction is larger than the size of the first semiconductor layer 22 in the stacking direction. The second semiconductor layer 26 is of a second conductivity type different from the first conductivity type. The second semiconductor layer 26 is, for example, an n-type GaN layer doped with Si.

The second semiconductor layer 26 has a first contact surface 27 in contact with the second electrode 32. The first contact surface 27 has an uneven structure 28. The first contact surface 27 has an uneven shape. The uneven structure 28 is provided, for example, over the entirety of the first contact surface 27. The uneven structure 28 is formed by a protrusion 29. A plurality of the protrusions 29 are provided. The plurality of protrusions 29 are provided, for example, periodically. A height H of the protrusion 29 is, for example, 400 nm or more. A distance D between distal ends of adjacent ones of the protrusions 29 is 230 nm or less for example. The uneven structure 28 may be a moth-eye structure. Although not elaborated in the figures, the plurality of protrusions 29 may be randomly arranged.

In the light-emitting device 100, a pin diode is configured by the p-type first semiconductor layer 22, the i-type light-emitting layer 24, and the n-type second semiconductor layer 26. In the light-emitting device 100, when a forward bias voltage of the pin diode is applied between the first electrode 30 and the second electrode 32, an electric current is injected into the light-emitting layer 24 to cause recombination of electrons and holes in the light-emitting layer 24. This recombination causes light emission from the light-emitting layer 24.

The first electrode 30 is provided on the substrate 10. The first electrode 30 is provided between the substrate 10 and the first semiconductor layer 22. The first semiconductor layer 22 may be in ohmic contact with the first electrode 30. The first electrode 30 is electrically coupled to the first semiconductor layer 22. The first electrode 30 bonded to the substrate 10. The first electrode 30 reflects the light generated in the light-emitting layer 24 toward the second electrode 32 side.

The material of the first electrode 30 is Au for example. The first electrode 30 is one electrode for injecting an electric current into the light-emitting layer 24. For example, a potential of a data signal is applied to the first electrode 30.

The second electrode 32 is provided on the second semiconductor layer 26. The second electrode 32 is provided between the second semiconductor layer 26 and the second light-transmitting portion 90. The second electrode 32 is disposed to face the first electrode 30. The second semiconductor layer 26 may be in ohmic contact with the second electrode 32. The second electrode 32 is electrically coupled to the second semiconductor layer 26. The second electrode 32 has a light-transmitting property. The light generated in the light-emitting layer 24 transmits through the second electrode 32. The light generated in the light-emitting layer 24 is emitted from the second electrode 32 side.

The material of the second electrode 32 is, for example, indium tin oxide (ITO). The second electrode 32 is the other electrode for injecting an electric current into the light-emitting layer 24. For example, a constant potential is applied to the second electrode 32. A ground potential may be applied to the second electrode 32. Although not elaborated in the figure, when a plurality of light-emitting elements 2 are provided, the second electrode 32 may be a common electrode for the plurality of light-emitting elements 2.

The second electrode 32 has a second contact surface 34 in contact with the second semiconductor layer 26. The second contact surface 34 is in contact with the first contact surface 27. The second contact surface 34 has an uneven structure 36. The uneven structure 36 is provided, for example, over the entirety of the second contact surface 34. The uneven structure 36 has a shape corresponding to the uneven structure 28 of the first contact surface 27. Protrusions forming the uneven structure 36 are located between adjacent ones of the protrusions 29 forming the uneven structure 28.

The refractive index of the second electrode 32 is lower than the refractive index of the second semiconductor layer 26 and higher than the refractive index of the second light-transmitting portion 90. When the material of the second electrode 32 is ITO, the refractive index of the second electrode 32 is, for example, 2.1. When the material of the second semiconductor layer 26 is GaN, the refractive index of the second semiconductor layer 26 is, for example, 2.4. When the material of the second light-transmitting portion 90 is SiON, the refractive index of the second light-transmitting portion 90 is, for example, 1.68.

The first light-transmitting portion 40 is provided on the side surface 21 of the tapered portion **20*a*. The first light-transmitting portion 40 is provided between the stacked body 20 and the first metal layer 50. The first light-transmitting portion 40 is provided over the entirety of the side surface 21 for example. The first light-transmitting portion 40 surrounds the stacked body 20** as viewed in the stacking direction.

The light generated in the light-emitting layer 24 transmits through the first light-transmitting portion 40. The refractive index of the first light-transmitting portion 40 is lower than the refractive index of the stacked body 20. Specifically, the refractive index of the first light-transmitting portion 40 is lower than the refractive index of the first semiconductor layer 22, the refractive index of the light-emitting layer 24, and the refractive index of the second semiconductor layer 26. For example, the refractive index of the first light-transmitting portion 40 is lower than the refractive index of the second light-transmitting portion 90. The first light-transmitting portion 40 is a $SiO_2$ layer, for example.

The first metal layer 50 is provided on the side surface 21 of the tapered portion **20*a* via the first light-transmitting portion 40. The first metal layer 50 is provided between the first light-transmitting portion 40 and the insulating portion 60. The first metal layer 50 surrounds the stacked body 20 and the first light-transmitting portion 40 as viewed in the stacking direction. The first metal layer 50 extends along the side surface 21. The first metal layer 50 and the first electrode 30 are separated and electrically insulated from each other. The insulating portion 60 is provided between the first metal layer 50 and the first electrode 30. In the illustrated example, the first metal layer 50 and the second electrode 32 are separated and electrically insulated from each other. The insulating portion 60 is provided between the first metal layer 50 and the second electrode 32. The first metal layer 50 overlaps the first semiconductor layer 22, the light-emitting layer 24, and the second semiconductor layer 26** as viewed in a direction orthogonal to the stacking direction.

The first metal layer 50 includes a reflective surface 52 that reflects light generated in the light-emitting layer 24. The reflective surface 52 faces the side surface 21 of the tapered portion **20*a*. In the illustrated example, the reflective surface 52 is parallel to the side surface 21. The first metal layer 50** is, for example, an Au layer or an Ag layer.

The insulating portion 60 is provided on a lateral side of the stacked body 20. In the illustrated example, the insulating portion 60 is provided on a lateral side of the first semiconductor layer 22, the light-emitting layer 24, and the second semiconductor layer 26. For example, the insulating portion 60 is in contact with the first light-transmitting portion 40 and the first metal layer 50. The insulating portion 60 surrounds the stacked body 20, the first light-transmitting portion 40, and the first metal layer 50 as viewed in the stacking direction. The insulating portion 60 may be provided integrally with the first light-transmitting portion 40. The material of the insulating portion 60 is, for example, the same as that of the first light-transmitting portion 40.

The wiring layer 70 is provided on the insulating portion 60. The wiring layer 70 is provided between the insulating portion 60 and the metal portion 80. The wiring layer 70 is coupled to the second electrode 32. The second electrode 32 is electrically coupled to an unillustrated power supply via the wiring layer 70. The wiring layer 70 may be provided integrally with the second electrode 32. The material of the wiring layer 70 is, for example, the same as that of the second electrode 32.

The metal portion 80 is provided on the wiring layer 70. The metal portion 80 is provided on a side surface 91 of the second light-transmitting portion 90. The metal portion 80 surrounds the second light-transmitting portion 90 as viewed in the stacking direction. The metal portion 80 includes a reflective surface 82 that reflects light generated in the light-emitting layer 24. The reflective surface 82 is in contact with the side surface 91. In the illustrated example, the reflective surface 82 is parallel to the side surface 91. The sum of the size of the metal portion 80 in the stacking direction, the size of the wiring layer 70 in the stacking direction, and the size of the insulating portion 60 in the stacking direction is, for example, 4 μm or more and 5 μm or less. The material of the metal portion 80 is, for example, Al.

The second light-transmitting portion 90 is provided on the second electrode 32. The second light-transmitting portion 90 is provided on the side of the second electrode 32 opposite to the second semiconductor layer 26. The second light-transmitting portion 90 is provided on the side of the second electrode 32 opposite to the stacked body 20. The light generated in the light-emitting layer 24 transmits through the second light-transmitting portion 90. The refractive index of the second light-transmitting portion 90 is lower than the refractive index of the stacked body 20. Specifically, the refractive index of the second light-transmitting portion 90 is lower than the refractive index of the first semiconductor layer 22, the refractive index of the light-emitting layer 24, and the refractive index of the second semiconductor layer 26. The refractive index of the second light-transmitting portion 90 is lower than the refractive index of the second electrode 32. The material of the first light-transmitting portion 40 is, for example, SiON.

The second light-transmitting portion 90 includes, for example, a tapered portion 92 and a lens portion 94.

The tapered portion 92 of the second light-transmitting portion 90 is provided between the second electrode 32 and the lens portion 94. The tapered portion 92 is surrounded by the metal portion 80 as viewed in the stacking direction. The tapered portion 92 has a tapered shape that becomes wider from the second electrode 32 side toward the lens portion 94 side. The width of the tapered portion 92 gradually increases from the second electrode 32 to the lens portion 94. In the illustrated example, the tapered portion 92 has a trapezoidal shape. The width of the upper surface of the tapered portion 92 is, for example, 6.8 μm or less. The tapered portion 92 has the side surface 91. The side surface 91 is inclined with respect to the stacking direction. An inclination angle $\theta 2$ of the side surface 91 with respect to the stacking direction is, for example, the same as the inclination angle $\theta 1$ of the side surface 21 with respect to the stacking direction. A perpendicular line P2 of the side surface 91 is parallel to a perpendicular line P1 of the side surface 21, for example. In the illustrated example, the side surface 21 and the side surface 91 are located on the same plane.

The lens portion 94 of the second light-transmitting portion 90 is provided on the tapered portion 92. The lens portion 94 is, for example, a convex lens. The lens portion 94 may be a microlens. The lens portion 94 has a lens surface 96 that refracts light generated in the light-emitting layer 24. The size of the lens portion 94 in the stacking direction is, for example, 2 μm or more and 3 μm or less. The lens surface 96 is a surface of the second light-transmitting portion 90 on the side opposite to the second electrode 32. The lens surface 96 is, for example, a convex surface. The lens surface 96 condenses, for example, light generated in the light-emitting layer 24. The lens surface 96 may diffuse the light generated in the light-emitting layer 24.

The light-transmitting layer 98 is provided on the lens surface 96. The light-transmitting layer 98 transmits the light generated in the light-emitting layer 24. The refractive index of the light-transmitting layer 98 is, for example, lower than the refractive index of the second light-transmitting portion 90. The light generated in the light-emitting layer 24 is emitted from the light-transmitting layer 98. The light-transmitting layer 98 is a $SiO_2$ layer, for example.

While the light-emitting layer 24 described above is InGaN based, the light-emitting layer 24 may be made of various materials capable of emitting light when an electric current is injected thereto, depending on the wavelength of light to be emitted. For example, semiconductor materials that are AlGaN based, AlGaAs based, InGaAs based, InGaAsP based, InP based, GaP based, AlGaP based, and the like can be used.

Although the first conductivity type and the second conductivity type are respectively described above as p-type and n-type, the first conductivity type may be n-type and the second conductivity type may be p-type.

Although not elaborated in the figures, the stacked body 20 may include a plurality of nanostructures.

1.2. Effects

The light-emitting device 100 includes the first electrode 30, the second electrode 32 that is disposed to face the first electrode 30 and has a light-transmitting property, and the stacked body 20 that is provided between the first electrode 30 and the second electrode 32 and includes the tapered portion **20*a* having a tapered shape having a width increasing from a side of the first electrode 30 toward a side of the second electrode 32. The light-emitting device 100 further includes the first light-transmitting portion 40 serving as a first low refractive index portion that is provided on the side surface 21 of the tapered portion 20*a* and has a lower refractive index than the stacked body 20, the second light-transmitting portion 90 serving as a second low refractive index portion that is provided on a side of the second electrode 32 opposite to the stacked body 20 and has a lower refractive index than the stacked body 20, and the metal portion 80 provided on the side surface 91 of the second light-transmitting portion 90. The stacked body 20 includes the first semiconductor layer 22 of a first conductivity type, the second semiconductor layer 26 of a second conductivity type different from the first conductivity type that is provided between the first semiconductor layer 22 and the second electrode 32, and the light-emitting layer 24 that is provided between the first semiconductor layer 22 and the second semiconductor layer 26. Light generated in the light-emitting layer 24 is emitted from the side of the second electrode 32, and a surface of the second light-transmitting portion 90 on a side opposite to the second electrode 32 is the lens surface 96**.

Therefore, in the light-emitting device 100, the light generated in the light-emitting layer 24 can be reflected by the metal portion 80, whereby the light leaking from the side surface 91 of the second light-transmitting portion 90 can be reduced. For example, the reflectance of light can be improved as compared with a case where a non-metal body made of $Sio_2$ or a resin is provided instead of the metal portion and light is reflected at an interface between the light-transmitting portion and the non-metal body.

In the light-emitting device 100, the light generated in the light-emitting layer 24 can be reflected at the interface between the tapered portion 20*a* and the first light-transmitting portion 40.

Furthermore, in the light-emitting device 100, the light generated in the light-emitting layer 24 can be refracted using the lens surface 96. Thereby, for example, the light generated in the light-emitting layer 24 can be condensed without designing the metal portion 80 to be excessively high. Therefore, it is possible to refract the light generated in the light-emitting layer 24 while reducing the light loss due to multiple reflection in the metal portion 80.

According to the above, with the light-emitting device 100, the light extraction efficiency can be improved.

In the light-emitting device 100, the perpendicular line P2 of the side surface 91 of the second light-transmitting portion 90 is parallel to the perpendicular line P1 of the side surface 21 of the tapered portion 20*a*. Therefore, in the light-emitting device 100, light generated in the light-emitting layer 24 can be more condensed than in a case where, for example, the perpendicular line P2 is not parallel to the perpendicular line P1 and the inclination angle θ2 of the side surface 91 with respect to the stacking direction is larger than the inclination angle θ1 of the side surface 21 with respect to the stacking direction.

In the light-emitting device 100, the refractive index of the first light-transmitting portion 40 is lower than the refractive index of the second light-transmitting portion 90. Therefore, in the light-emitting device 100, a large difference between the refractive index of the first light-transmitting portion 40 and the refractive index of the stacked body 20 can be achieved, for example, as compared with a case where the refractive index of the first light-transmitting portion is the same as the refractive index of the second light-transmitting portion. Thereby, it is possible to reflect the light generated in the light-emitting layer 24 at the interface between the first light-transmitting portion 40 and the stacked body 20.

In the light-emitting device 100, the refractive index of the second light-transmitting portion 90 is lower than the refractive index of the second electrode 32. Therefore, in the light-emitting device 100, it is possible to achieve a small refractive index of the light-emitting element 2 from the light-emitting layer 24 toward the lens surface 96. Thus, the light extraction efficiency can be improved.

The light-emitting device 100 includes the light-transmitting layer 98 provided on the lens surface 96. Therefore, in the light-emitting device 100, the lens surface 96 can be protected by the light-transmitting layer 98.

In the light-emitting device 100, the refractive index of the light-transmitting layer 98 is lower than the refractive index of the second light-transmitting portion 90. Therefore, in the light-emitting device 100, a small refractive index difference between the light-emitting element 2 and the air layer can be achieved. Thus, the light extraction efficiency can be improved.

In the light-emitting device 100, the first contact surface 27 that is in contact with the second electrode 32 of the second semiconductor layer 26 has the uneven structure 28. Therefore, in the light-emitting device 100, the uneven structure 28 can achieve a smooth change in the refractive index at the interface between the second semiconductor layer 26 and the second electrode 32 in the direction from the second semiconductor layer 26 toward the second electrode 32. Thus, light reflected at the interface between the second semiconductor layer 26 and the second electrode 32 can be reduced. Accordingly, light extraction efficiency can be improved.

In the light-emitting device 100, the second contact surface 34 of the second electrode 32 that is in contact with the second semiconductor layer 26 has the uneven structure 36. Thus, with the light-emitting device 100, the light extraction efficiency can be improved.

The light-emitting device 100 includes the first metal layer 50 provided on the side surface 21 of the tapered portion 20*a*, and the first metal layer 50 and the first electrodes 30 are separated and electrically insulated from each other. Therefore, in the light-emitting device 100, the light generated in the light-emitting layer 24 can be reflected by the first metal layer 50, whereby the light leaking from the side surface 21 can be reduced. Thus, the light extraction efficiency can be improved. For example, when the first metal layer is not provided and light is to be reflected at the interface between the stacked body and the non-metal body such as $SiO_2$, light incident on the interface at an angle equal to or less than the critical angle cannot be reflected, and the light use efficiency decreases. The critical angle of SiO is, for example, 35° or more and 40° or less.

Furthermore, in the light-emitting device 100, the parasitic capacitance of the first electrode 30 can be reduced as compared with a case where the first metal layer and the first electrode are electrically coupled to each other. When the first metal layer and the first electrode are electrically coupled to each other, the distance between the metal body including the first metal layer and the first electrode and the second electrode is short, resulting in large parasitic capacitance of the first electrode. In particular, when the potential of the data signal is applied to the first electrode 30, it is desirable to reduce the parasitic capacitance.

In the light-emitting device 100, the first metal layer 50 is provided on the side surface 21 of the tapered portion 20*a* via the first light-transmitting portion 40. Therefore, in the light-emitting device 100, the light transmitted through the first light-transmitting portion 40 can be reflected toward the stacked body 20 side by the first metal layer 50.

Figure 2:
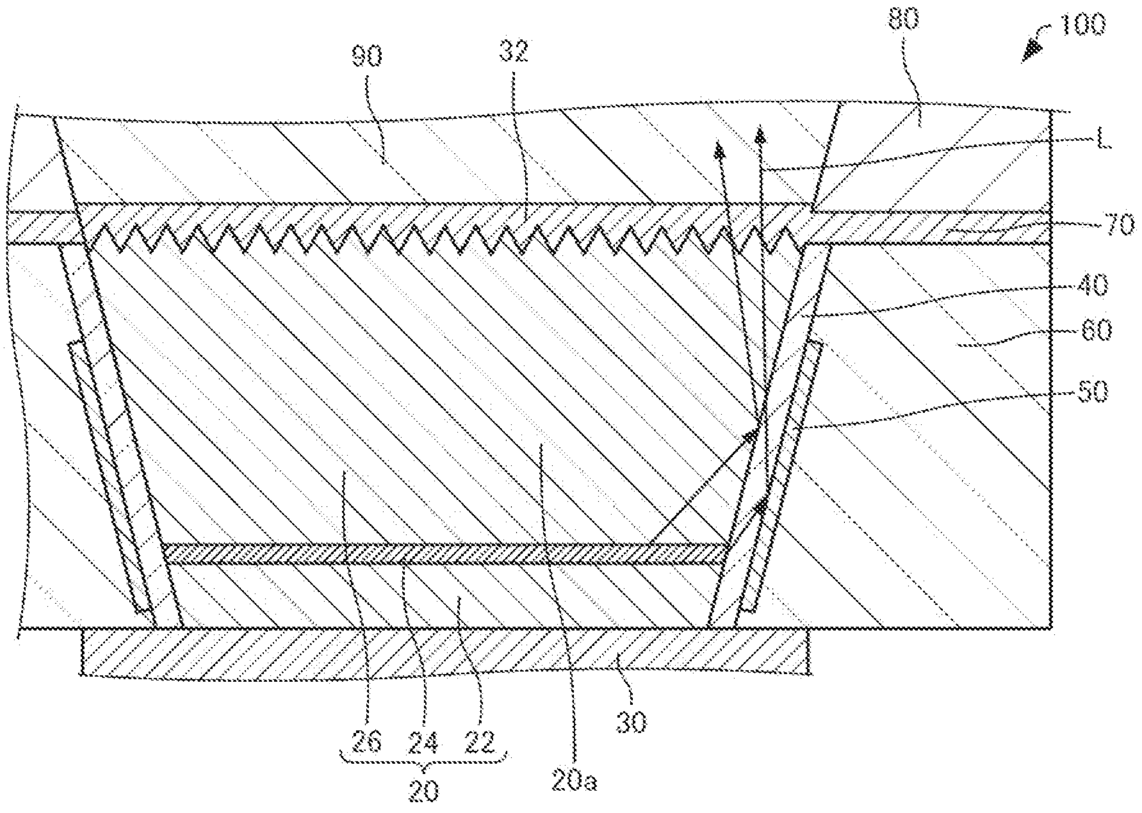
FIG. 2 is a cross-sectional view schematically illustrating the light-emitting device according to the present embodiment.
Figure 3:
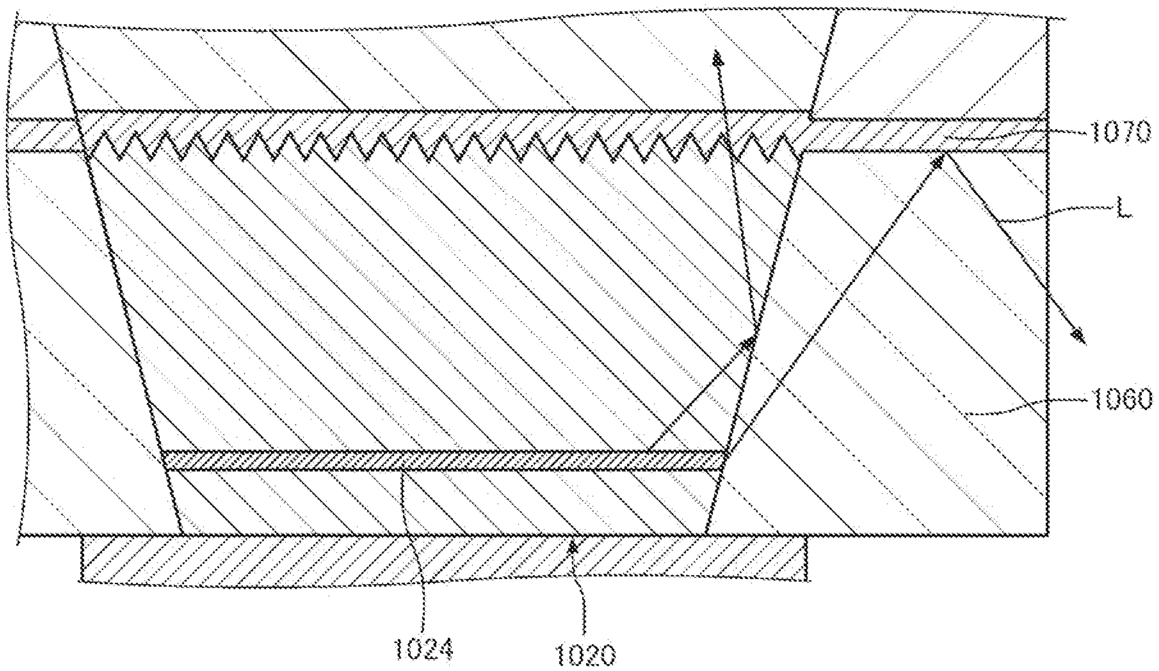
FIG. 3 is a cross-sectional view schematically illustrating a light-emitting device according to Reference Example.

In the light-emitting device 100, the first metal layer 50 overlaps the light-emitting layer 24 as viewed in a direction orthogonal to the stacking direction. Therefore, in the light-emitting device 100, as illustrated in FIG. 2, light L emitted from the side surface of the light-emitting layer 24 can be reflected toward the stacked body 20 side by the first metal layer 50. Thus, the light extraction efficiency can be improved. As illustrated in FIG. 3, when the first metal layer is not provided, the light L emitted from the side surface of a light-emitting layer 1024 is transmitted through an insulating portion 1060 without being reflected at the interface between a stacked body 1020 and an insulating portion 1060 depending on the incident angle. Then, the light L is reflected by a wiring layer 1070 and is incident on, for example, an adjacent light-emitting element (not illustrated), resulting in crosstalk.

FIG. 2 is a cross-sectional view schematically illustrating a light-emitting device 100 according to the present example. FIG. 3 is a cross-sectional view schematically illustrating a light-emitting device according to Reference Example.

2. METHOD FOR MANUFACTURING LIGHT-EMITTING DEVICE

Figure 4:
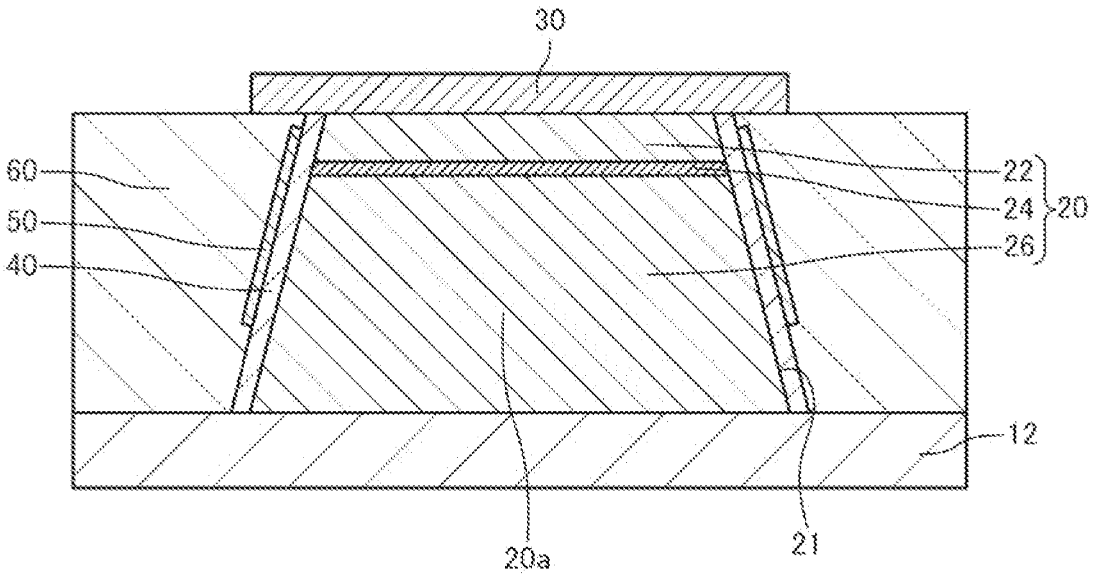
FIG. 4 is a cross-sectional view schematically illustrating a manufacturing step of the light-emitting device according to the present embodiment.
Figure 5:
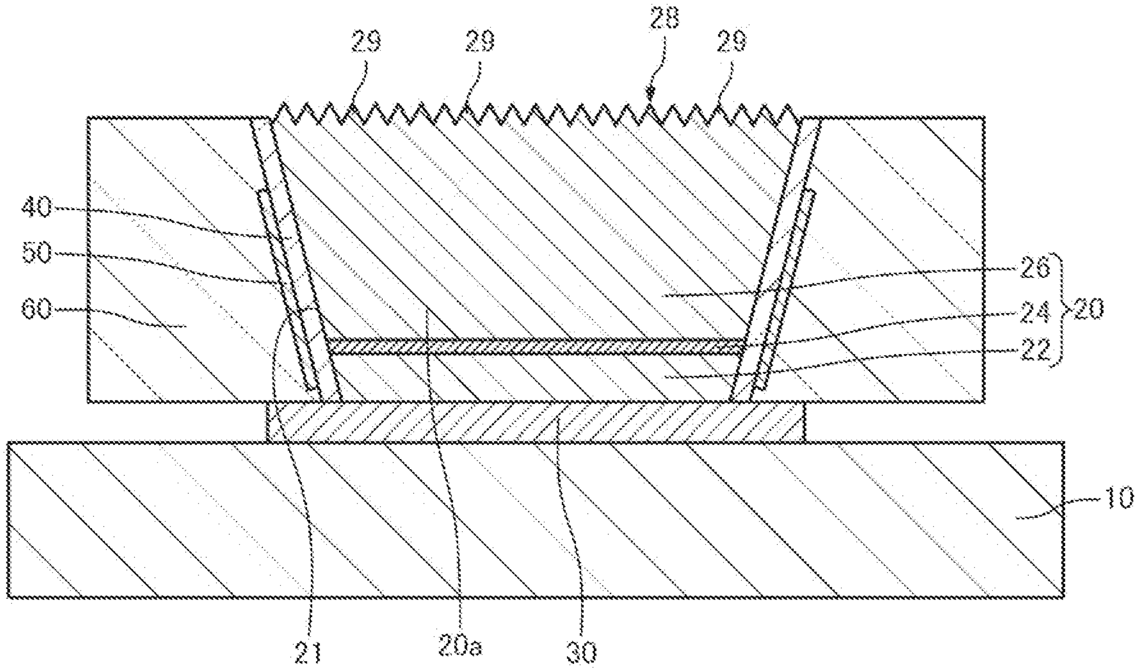
FIG. 5 is a cross-sectional view schematically illustrating a manufacturing step of the light-emitting device according to the present embodiment.

Next, a method for manufacturing the light-emitting device 100 according to the present embodiment will be described with reference to the drawings. FIG. 4 and FIG. 5 are cross-sectional views schematically illustrating a manufacturing steps of the light-emitting device 100 according to the present embodiment.

As illustrated in FIG. 4, the second semiconductor layer 26, the light-emitting layer 24, and the first semiconductor layer 22 are epitaxially grown on a growth substrate 12 in this order. Examples of the epitaxial growth method include a metal organic chemical vapor deposition (MOCVD) method and a molecular beam epitaxy (MBE) method. Through this step, the stacked body 20 is formed. The growth substrate 12 is, for example, an Si substrate, a GaN substrate, a sapphire substrate, a silicon substrate, or an SiC substrate. The growth substrate 12 is a substrate for epitaxially growing the stacked body 20.

Next, the stacked body 20 is patterned. The patterning is performed such that the side surface 21 of the tapered portion 20*a* of the stacked body 20 is inclined with respect to the stacking direction. The patterning is performed by photolithography and etching, for example.

Next, the first light-transmitting portion 40 is formed on the side surface 21 of the tapered portion 20*a*. The first light-transmitting portion 40 is formed by a Chemical Vapor Deposition (CVD) method or a sputtering method for example.

Next, the first metal layer 50 is formed on a lateral side of the first light-transmitting portion 40. The first metal layer 50 is formed by, for example, a sputtering method, a CVD method, or a vacuum deposition method.

Next, the insulating portion 60 is formed on a lateral side of the first metal layer 50 and a lateral side of the first light-transmitting portion 40. The insulating portion 60 is formed by a CVD method or a sputtering method for example.

Next, the first electrode 30 is formed on the second semiconductor layer 26. The first electrode 30 is formed by, for example, a sputtering method, a CVD method, or a vacuum deposition method.

As illustrated in FIG. 5, a structure including the growth substrate 12, the stacked body 20, the first electrode 30, the first light-transmitting portion 40, the first metal layer 50, and the insulating portion 60 is bonded to the substrate 10 with the first electrode 30 side facing the substrate 10. The bonding is performed using solder or silver paste, for example.

Next, the growth substrate 12 is removed to expose the second semiconductor layer 26. The growth substrate 12 is removed by, for example, Chemical Mechanical Polisher (CMP).

Next, the upper surface of the second semiconductor layer 26 is patterned to form the uneven structure 28. The patterning is performed by photolithography and etching, for example. When the uneven structure 28 in which the protrusions 29 are randomly arranged is formed, the uneven structure 28 can be formed by performing dry etching on the entire upper surface of the second semiconductor layer 26 and then performing wet etching on the entire upper surface.

As illustrated in FIG. 1, the second electrode 32 is formed on the second semiconductor layer 26, and the wiring layer 70 is formed on the insulating portion 60. The second electrode 32 and the wiring layer 70 are formed by, for example, a sputtering method, a CVD method, or a vacuum deposition method. Since the second electrode 32 is formed on the uneven structure 28, the uneven structure 36 corresponding to the uneven structure 28 is formed in the second electrode 32.

Next, the metal portion 80 is formed on the wiring layer 70. The metal portion 80 is formed by, for example, a sputtering method, a CVD method, a vacuum deposition method, or a plating method.

Next, the second light-transmitting portion 90 is formed on the second electrode 32. The second light-transmitting portion 90 is formed by a sputtering method or a CVD method for example.

Next, the upper surface of the second light-transmitting portion 90 is patterned to form the lens surface 96. The patterning is performed by photolithography and etching, for example.

Next, the light-transmitting layer 98 is formed on the lens surface 96. The light-transmitting layer 98 is formed by a sputtering method or a CVD method for example.

The light-emitting device 100 can be manufactured by performing the steps described above.

3. MODIFIED EXAMPLES OF LIGHT-EMITTING DEVICE

3.1. First Modified Example

Figure 6:
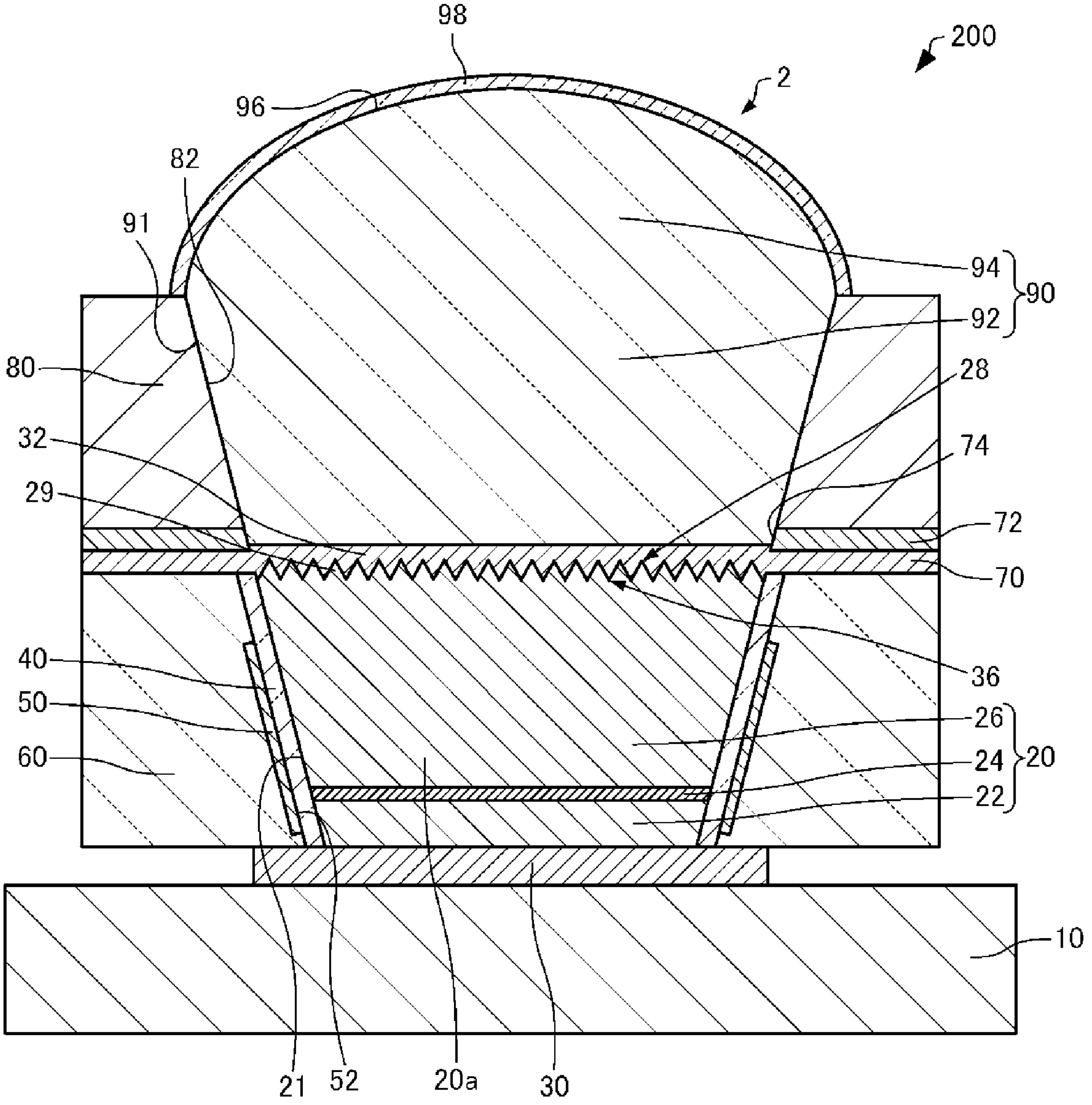
FIG. 6 is a cross-sectional view schematically illustrating a light-emitting device according to a first modified example of the present embodiment.

Next, a light-emitting device according to a first modified example of the present embodiment will be described with reference to the drawings. FIG. 6 is a cross-sectional view schematically showing a light-emitting device 200 according to the first modified example of the present embodiment.

In the following description, in the light-emitting device 200 according to the first modified example of the present embodiment, members having the same functions as the constituent members of the light-emitting device 100 according to the present embodiment described above will be denoted by the same reference numerals and detailed description thereof will be omitted. The same applies to light-emitting devices according to second to fifth modified examples of the present embodiment, which will be described later.

As illustrated in FIG. 6, the light-emitting device 200 is different from the above-described light-emitting device 100 in that a bonding layer 72 is provided.

The bonding layer 72 is provided on the wiring layer 70. The bonding layer 72 is provided between the wiring layer 70 and the metal portion 80. The bonding layer 72 bonds the wiring layer 70 and the metal portion 80 to each other. The bonding layer 72 has conductivity. The bonding layer 72 has a reflective surface 74 that reflects light generated in the light-emitting layer 24. The reflective surface 74 is in contact with the side surface 91 of the second light-transmitting portion 90. In the illustrated example, the reflective surface 74 is parallel to the side surface 91. The bonding layer 72 is, for example, a TiN layer. The bonding layer 72 is formed by, for example, a sputtering method, a CVD method, or a vacuum deposition method.

The light-emitting device 200 includes the bonding layer 72 provided between the wiring layer 70 and the metal portion 80. Therefore, in the light-emitting device 200, the adhesion between the wiring layer 70 and the metal portion 80 can be improved.

In the light-emitting device 200, the bonding layer 72 has conductivity. Therefore, in the light-emitting device 200, the second electrode 32 can be electrically coupled to a power supply (not illustrated) not only via the wiring layer 70 but also via the bonding layer 72 and the metal portion 80. Accordingly, it is possible to reduce the resistance of the wiring for causing the electric current to flow through the second electrode 32.

In the light-emitting device 200, the bonding layer 72 has the reflective surface 74 that is in contact with the side surface 91 of the second light-transmitting portion 90, and the reflective surface 74 reflects light generated in the light-emitting layer 24. Therefore, in the light-emitting device 200, the light generated in the light-emitting layer 24 can be reflected by the bonding layer 72, whereby the light leaking from the side surface 91 can be reduced. Thus, the light extraction efficiency can be improved.

3.2. Second Modified Example

Figure 7:
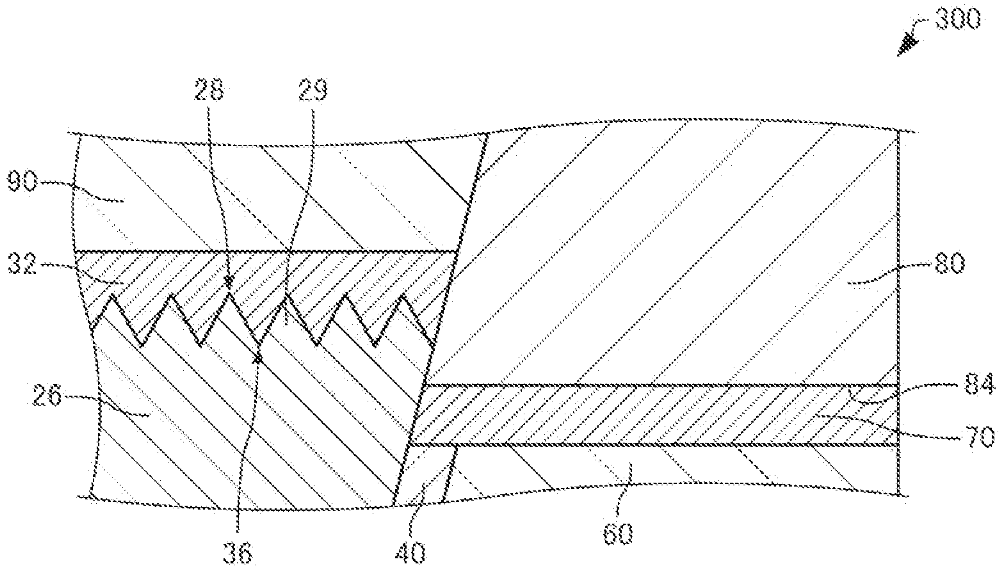
FIG. 7 is a cross-sectional view schematically illustrating a light-emitting device according to a second modified example of the present embodiment.

Next, a light-emitting device according to a second modified example of the present embodiment will be described with reference to the drawings. FIG. 7 is a cross-sectional view schematically illustrating a light-emitting device 300 according to the second modified example of the present embodiment. For convenience, FIG. 7 is an enlarged view of the light-emitting device 300.

The light-emitting device 300 differs from the light-emitting device 100 in that the uneven structure 28 of the second semiconductor layer 26 overlaps the metal portion 80 as viewed in a direction orthogonal to the stacking direction as illustrated in FIG. 7.

In the illustrated example, the position of the distal end of the protrusion 29 of the uneven structure 28 is located closer to the second light-transmitting portion 90 than the position of a lower surface 84 of the metal portion 80 in the stacking direction. As viewed in a direction orthogonal to the stacking direction, the lower surface 84 of the metal portion 80 overlaps a portion of the second semiconductor layer 26 that is not the uneven structure 28. As viewed in the direction orthogonal to the stacking direction, the uneven structure 36 of the second electrode 32 overlaps the metal portion 80. In the illustrated example, the second electrode 32 is separated from the wiring layer 70. The second electrode 32 is coupled to the metal portion 80.

Figure 8:
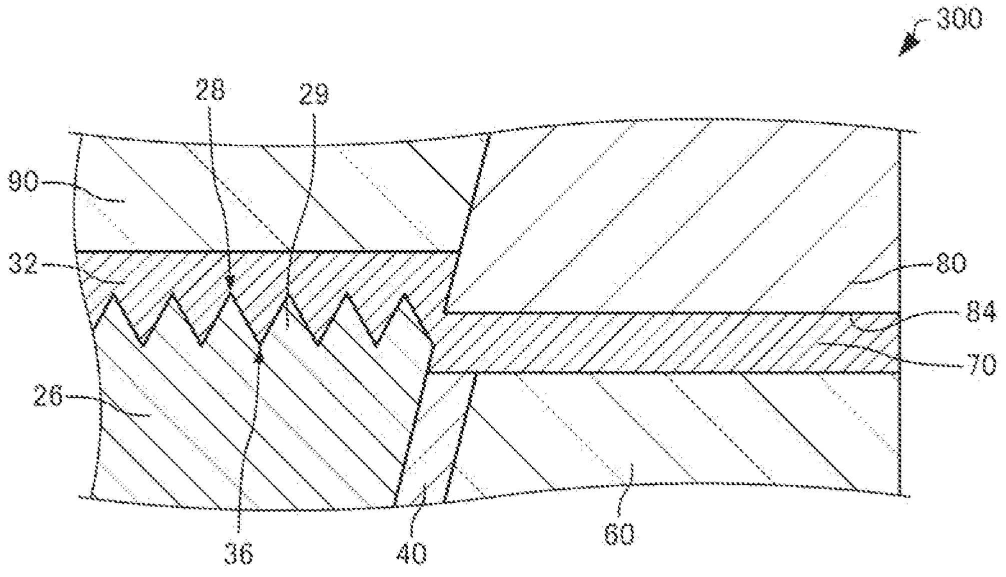
FIG. 8 is a cross-sectional view schematically illustrating the light-emitting device according to the second modified example of the present embodiment.
Figure 9:
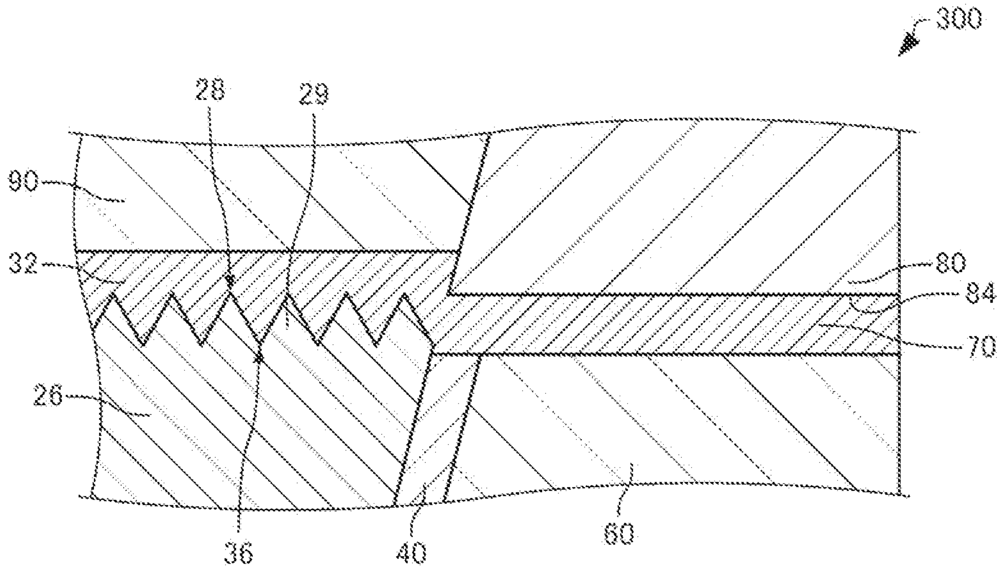
FIG. 9 is a cross-sectional view schematically illustrating the light-emitting device according to the second modified example of the present embodiment.

The position of the lower surface 84 of the metal portion 80 is not particularly limited as long as the uneven structure 28 overlaps the metal portion 80 as viewed in the direction orthogonal to the stacking direction. As viewed in the direction orthogonal to the stacking direction, the lower surface 84 may overlap the protrusion 29 of the uneven structure 28 as illustrated in FIG. 8, or may overlap the distal end of the protrusion 29 as illustrated in FIG. 9.

In the light-emitting device 300, the uneven structure 28 overlaps the metal portion 80 as viewed in the direction orthogonal to the stacking direction. Therefore, in the light-emitting device 300, even when light is refracted in the uneven structure 28 in a direction crossing the stacking direction, the light can be reflected by the metal portion 80 toward the second light-transmitting portion 90. Thus, the light extraction efficiency can be improved.

3.3. Third Modified Example

Figure 10:
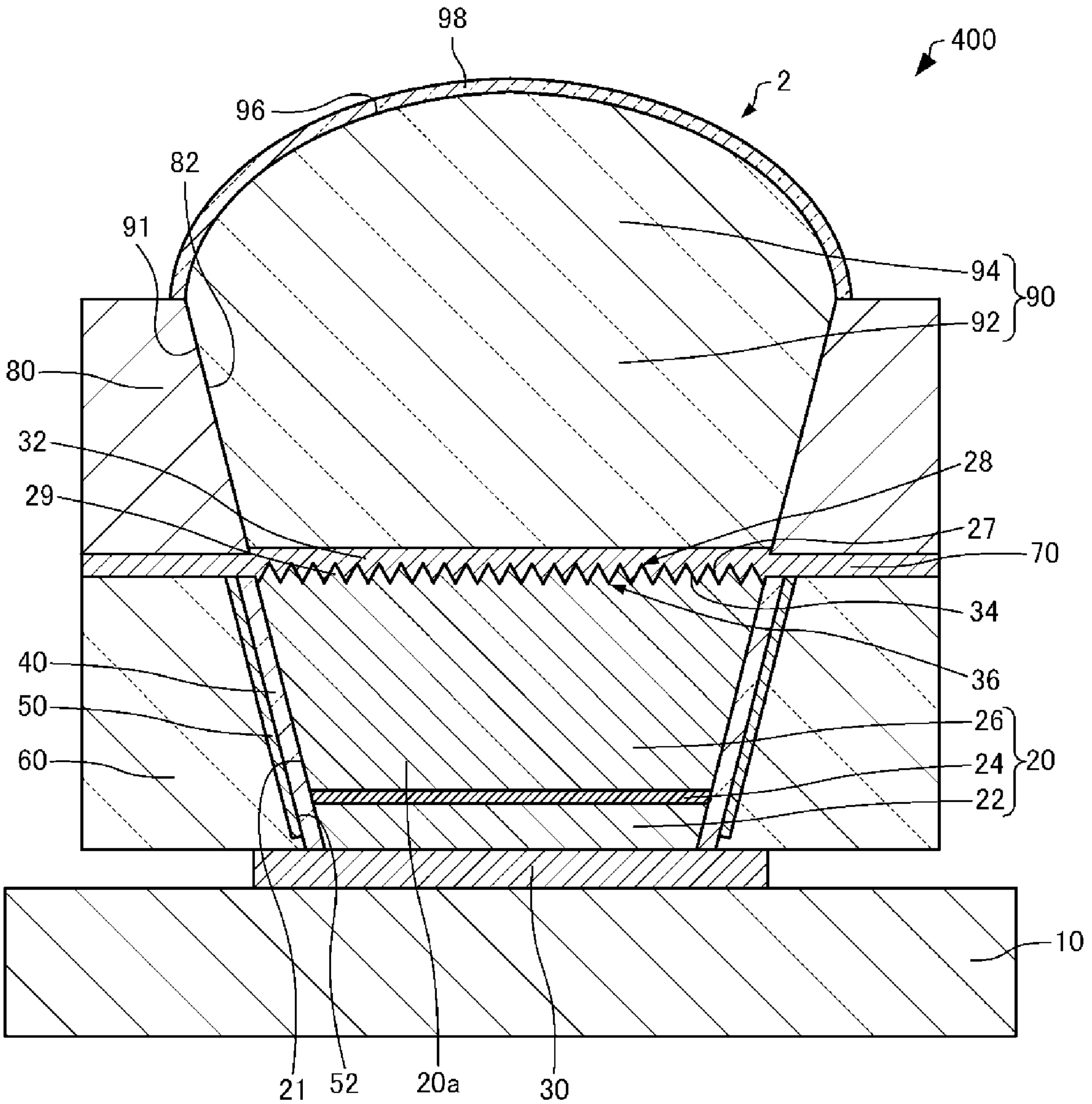
FIG. 10 is a cross-sectional view schematically illustrating a light-emitting device according to a third modified example of the present embodiment.

Next, a light-emitting device according to a third modified example of the present embodiment will be described with reference to the drawings. FIG. 10 is a cross-sectional view schematically illustrating a light-emitting device 400 according to the third modified example of the present embodiment.

As illustrated in FIG. 10, the light-emitting device 400 is different from the above-described light-emitting device 100 in that the first metal layer 50 is electrically coupled to the second electrode 32.

The first metal layer 50 is coupled to the wiring layer 70. The first metal layer 50 is electrically coupled to the second electrode 32 via the wiring layer 70. A constant potential is applied to the second electrode 32. As viewed in a direction orthogonal to the stacking direction, the entire second semiconductor layer 26 overlaps the first metal layer 50. As viewed in a direction orthogonal to the stacking direction, the entire light-emitting layer 24 overlaps the first metal layer 50.

In the light-emitting device 400, a constant potential is applied to the second electrode 32, and the first metal layer 50 is electrically coupled to the second electrode 32. Therefore, in the light-emitting device 400, electromagnetic wave noise incident on the stacked body 20 can be reduced by the first metal layer 50. Furthermore, since the first metal layer 50 is coupled to the wiring layer 70, it is possible to suppress passage of light between the first metal layer 50 and the wiring layer 70.

Figure 11:
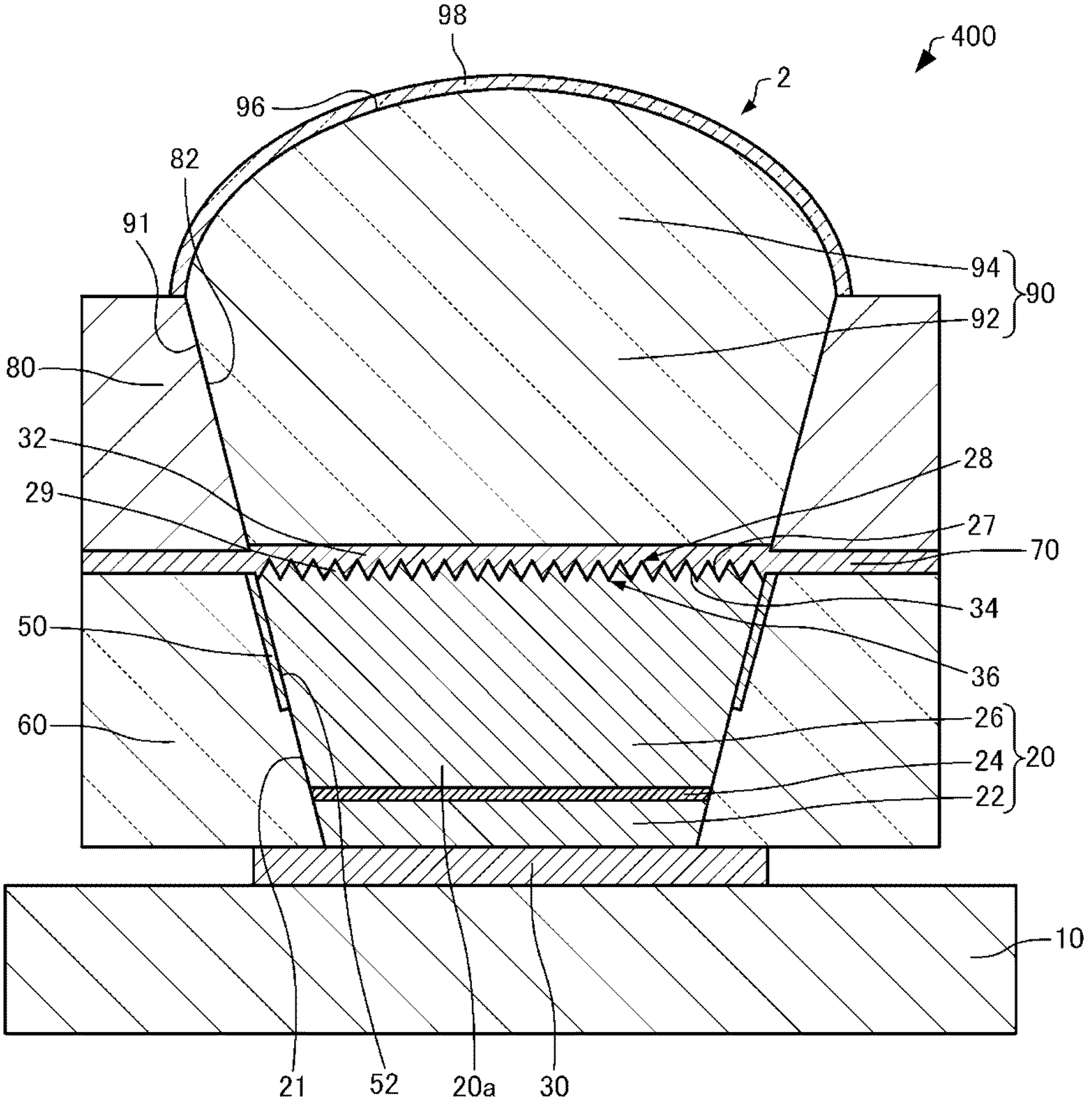
FIG. 11 is a cross-sectional view schematically illustrating the light-emitting device according to the third modified example of the present embodiment.

As illustrated in FIG. 11, the first metal layer 50 may be in contact with the side surface 21 of the tapered portion 20*a*. The first metal layer 50 is in contact with the second semiconductor layer 26. The first metal layer 50 is not in contact with the light-emitting layer 24 or the first semiconductor layer 22. In the illustrated example, the first light-transmitting portion 40 is not provided. When the first metal layer 50 is in contact with the second semiconductor layer 26, the contact resistance between the second semiconductor layer 26 and the metal body including the first metal layer 50 and the second electrode 32 can be reduced.

3.4. Fourth Modified Example

Figure 12:
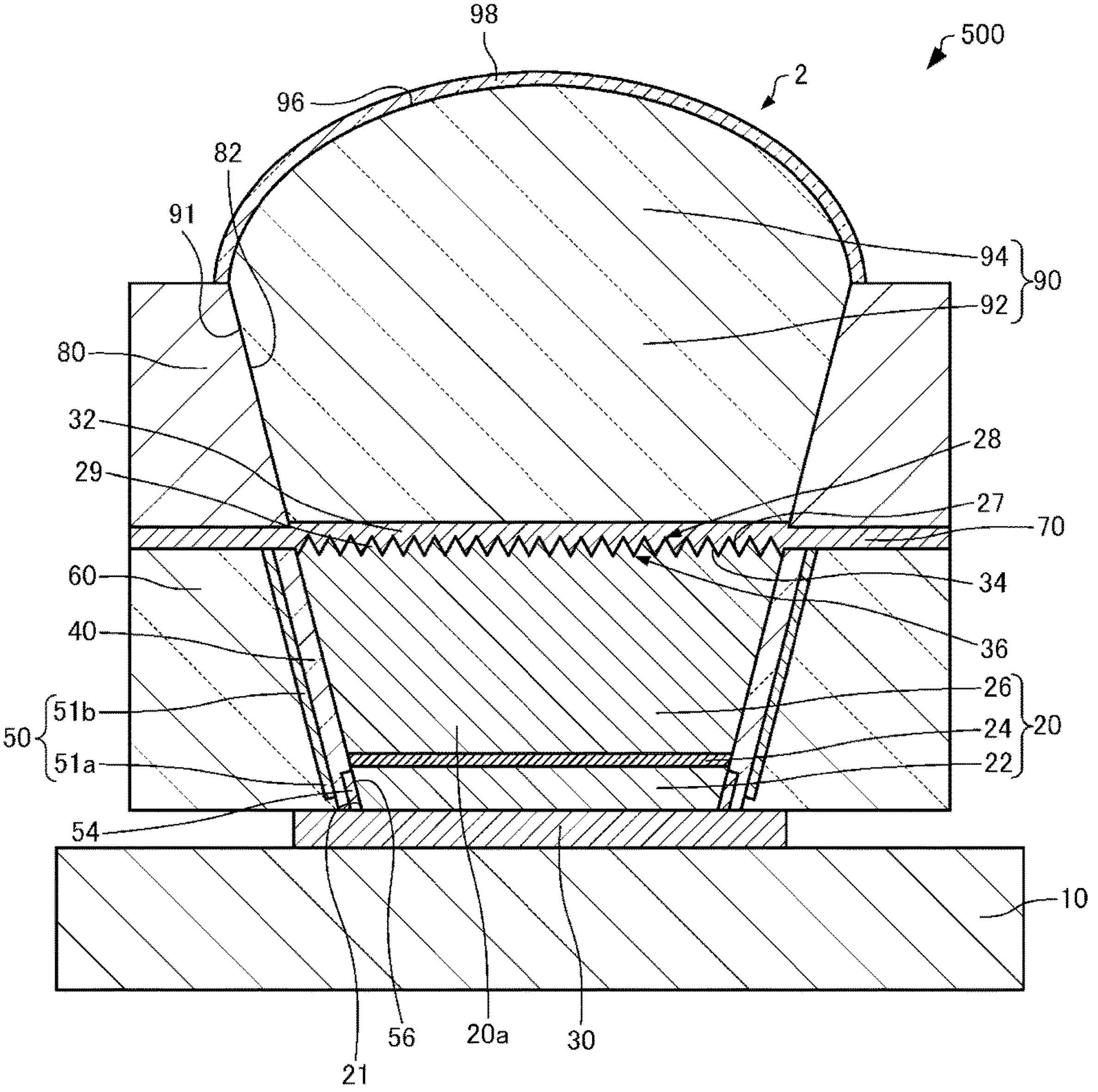
FIG. 12 is a cross-sectional view schematically illustrating a light-emitting device according to a fourth modified example of the present embodiment.

Next, a light-emitting device according to a fourth modified example of the present embodiment will be described with reference to the drawings. FIG. 12 is a cross-sectional view schematically illustrating a light-emitting device 500 according to the fourth modified example of the present embodiment.

The light-emitting device 500 is different from the above-described light-emitting device 100 in that a second metal layer 54 is provided as illustrated in FIG. 12.

The second metal layer 54 is in contact with the side surface 21 of the tapered portion 20*a*. In the illustrated example, the second metal layer 54 is in contact with the first semiconductor layer 22. The second metal layer 54 is not in contact with the light-emitting layer 24 or the second semiconductor layer 26. The second metal layer 54 surrounds the stacked body 20 as viewed in the stacking direction. The second metal layer 54 is separated from the first metal layer 50. In the illustrated example, the second metal layer 54 is coupled to the first electrode 30. Thus, it is possible to reduce the contact resistance between the first semiconductor layer 22 and the metal body including the second metal layer 54 and the first electrode 30. The second metal layer 54 is electrically separated from the second electrode 32.

The second metal layer 54 includes a reflective surface 56 that reflects light generated in the light-emitting layer 24. The reflective surface 56 is in contact with the side surface 21 of the tapered portion 20*a*. In the illustrated example, the reflective surface 56 is parallel to the side surface 21. The material of the second metal layer 54 is, for example, the same as that of the first metal layer 50. The second metal layer 54 is formed by, for example, the same method as the first metal layer 50.

The first metal layer 50 has an overlapping portion 51*a* that overlaps the second metal layer 54 and a non-overlapping portion 51*b* that does not overlap the second metal layer 54 as viewed in a direction orthogonal to the stacking direction. In the illustrated example, the non-overlapping portion 51*b* is coupled to the wiring layer 70.

Figure 13:
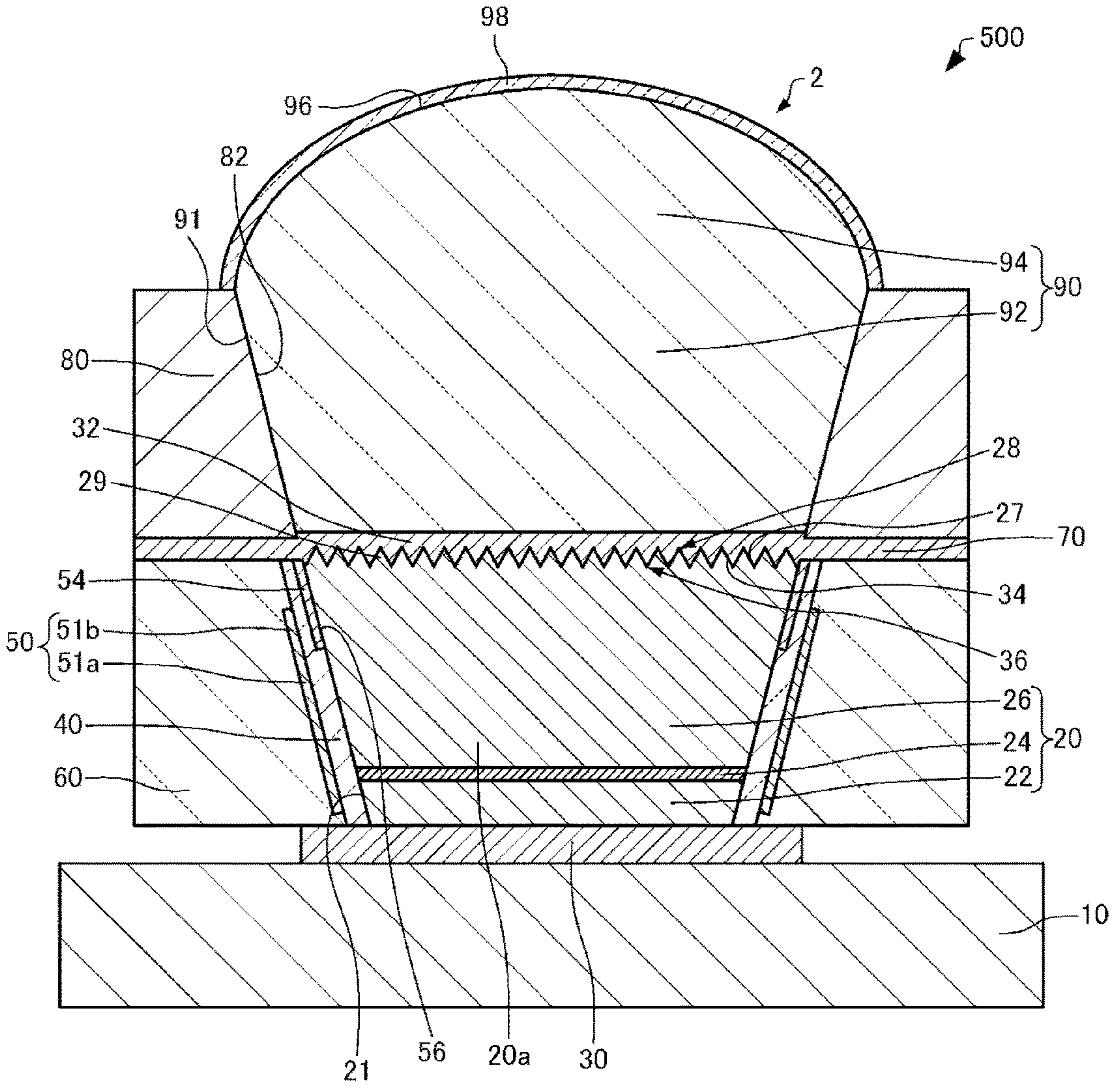
FIG. 13 is a cross-sectional view schematically illustrating the light-emitting device according to the fourth modified example of the present embodiment.

As illustrated in FIG. 13, the second metal layer 54 may be coupled to the wiring layer 70, and the first metal layer 50 may be separated from the wiring layer 70. In the illustrated example, the second metal layer 54 is in contact with the second semiconductor layer 26. Thus, the contact resistance between the metal body including the second metal layer 54 and the second electrode 32 and the second semiconductor layer 26 can be reduced. The second metal layer 54 is not in contact with the first semiconductor layer 22 or the light-emitting layer 24.

The light-emitting device 500 includes the second metal layer 54 in contact with the side surface 21 of the tapered portion 20*a*. Therefore, in the light-emitting device 500, the light generated in the light-emitting layer 24 can be reflected by the second metal layer 54, whereby the light leaking from the side surface 21 can be reduced.

In the light-emitting device 500, the first metal layer 50 has the overlapping portion 51*a* that overlaps the second metal layer 54 and the non-overlapping portion 51*b* that does not overlap the second metal layer 54 as viewed in a direction orthogonal to the stacking direction. Therefore, in the light-emitting device 500, it is possible to suppress the passage of light between the first metal layer 50 and the second metal layer 54.

3.5. Fifth Modified Example

Figure 14:
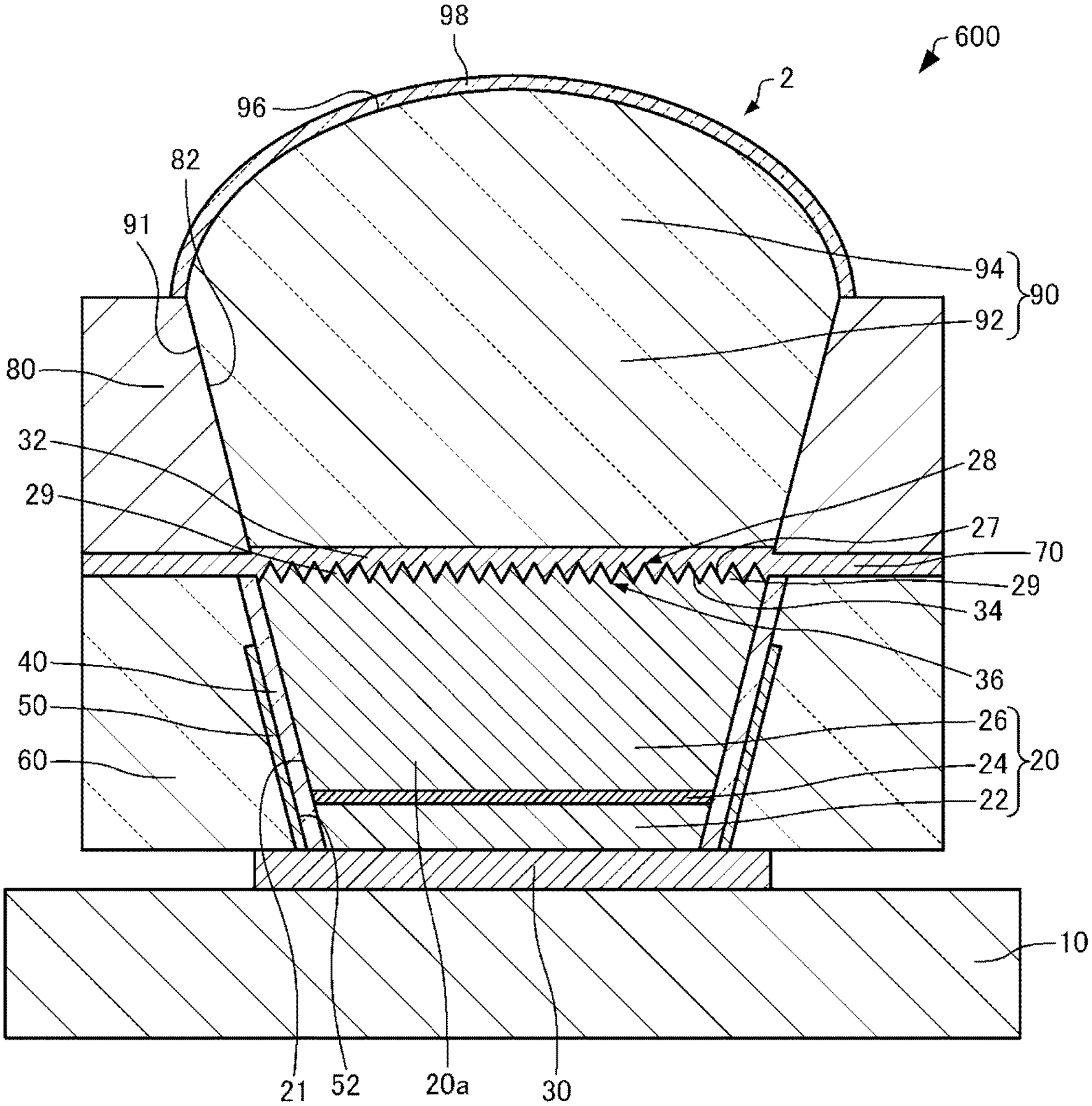
FIG. 14 is a cross-sectional view schematically illustrating a light-emitting device according to a fifth modified example of the present embodiment.

Next, a light-emitting device according to a fifth modified example of the present embodiment will be described with reference to the drawings. FIG. 14 is a cross-sectional view schematically illustrating a light-emitting device 600 according to the fifth modified example of the present embodiment.

As illustrated in FIG. 14, the light-emitting device 600 is different from the above-described light-emitting device 100 in that the first metal layer 50 is coupled to the first electrode 30.

In the light-emitting device 600, since the first metal layer 50 is coupled to the first electrode 30, it is possible to suppress passage of light between the first metal layer 50 and the first electrode 30.

4. PROJECTOR

Figure 15:
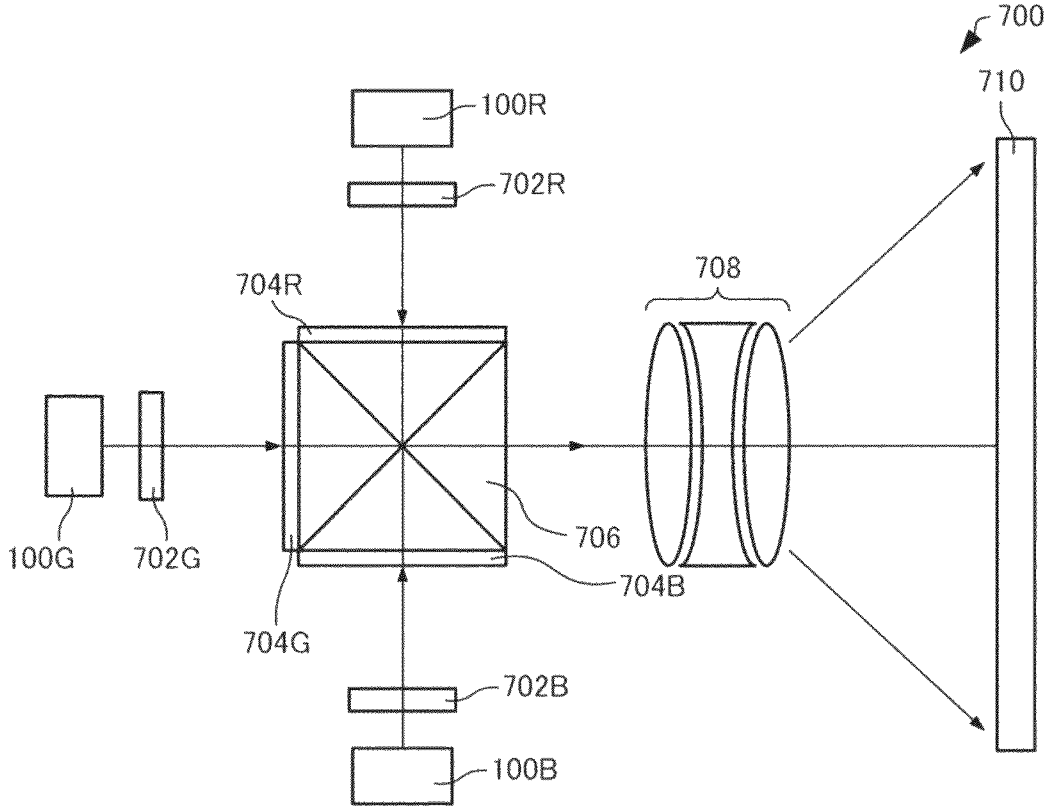
FIG. 15 is a diagram schematically showing a projector according to the present embodiment.

Next, a projector as a display device according to the present embodiment will be described with reference to the drawings. FIG. 15 is a diagram schematically showing a projector 700 according to the present embodiment.

The projector 700 includes, for example, the light-emitting device 100 as a light source.

The projector 700 includes a housing (not illustrated) and a red light source 100R, a green light source 100G, and a blue light source 100B that are provided in the housing and emit red light, green light, and blue light, respectively. For the sake of convenience, the red light source 100R, the green light source 100G, and the blue light source 100B illustrated in FIG. 15 are simplified.

The projector 700 further includes a first optical element 702R, a second optical element 702G, a third optical element 702B, a first optical modulation device 704R, a second optical modulation device 704G, a third optical modulation device 704B, and a projection device 708 which are provided in the housing for example. The first optical modulation device 704R, the second optical modulation device 704G, and the third optical modulation device 704B are, for example, transmissive liquid crystal light valves. The projection device 708 is, for example, a projection lens.

The light emitted from the red light source 100R is incident on the first optical element 702R. The light emitted from the red light source 100R is condensed by the first optical element 702R. Note that the first optical element 702R may have a function other than the condensing. The second optical element 702G and the third optical element 702B may also have a function other than the condensing.

The light condensed by the first optical element 702R is incident the first optical modulation device 704R. The first optical modulation device 704R modulates the incident light, based on image information. Then, the projection device 708 enlarges the image formed by the first optical modulation device 704R and projects the image on a screen 710.

The light emitted from the green light source 100G is incident on the second optical element 702G. The light emitted from the green light source 100G is condensed by the second optical element 702G.

The light condensed by the second optical element 702G is incident on the second optical modulation device 704G. The second optical modulation device 704G modulates the incident light, based on the image information. Then, the projection device 708 enlarges the image formed by the second optical modulation device 704G and projects the image on the screen 710.

The light emitted from the blue light source 100B is incident on the third optical element 702B. The light emitted from the blue light source 100B is condensed by the third optical element 702B.

The light condensed by the third optical element 702B is incident the third optical modulation device 704B. The third optical modulation device 704B modulates the incident light, based on the image information. Then, the projection device 708 enlarges the image formed by the third optical modulation device 704B and projects the image on the screen 710.

The projector 700 further includes a cross dichroic prism 706 that synthesizes the light emitted from the first optical modulation device 704R, the light emitted from the second optical modulation device 704G, and the light emitted from the third optical modulation device 704B and guides the resultant light to the projection device 708 for example.

Light of three colors modulated by the first optical modulation device 704R, the second optical modulation device 704G, and the third optical modulation device 704B is incident on the cross dichroic prism 706. In the cross dichroic prism 706, four right-angle prisms are bonded together, and on inner surfaces of the prisms are provided with a dielectric multilayer film configured to reflect the red light and a dielectric multilayer film configured to reflect the blue light. These dielectric multilayer films combine the three color lights to form light representing a color image. The synthesized light is projected onto the screen 710 by the projection device 708, and an image is enlarged to be displayed.

With the light-emitting devices 100 of the red light source 100R, the green light source 100G, and the blue light source 100B controlled as pixels of an image based on the image information, the image may be directly formed without using the first optical modulation device 704R, the second optical modulation device 704G, and the third optical modulation device 704B. The projection device 708 may enlarge the image formed by the red light source 100R, the green light source 100G, and the blue light source 100B and project the enlarged image on the screen 710.

Although the transmissive liquid crystal light valve is used as the optical modulation device in the above example, a light valve other than the liquid crystal light valve may be used, or a reflective light valve may be used. Examples of such a light valve include a reflective liquid crystal light valve and a digital micro mirror device. A configuration of the projection device is appropriately changed depending on a type of the light valve used.

The light source can also be applied to a light source device of a scanning type image display device including a scanning unit which is an image forming device for displaying an image of a desired size on a display surface by scanning a screen with light from the light source.

5. DISPLAY

Figure 16:
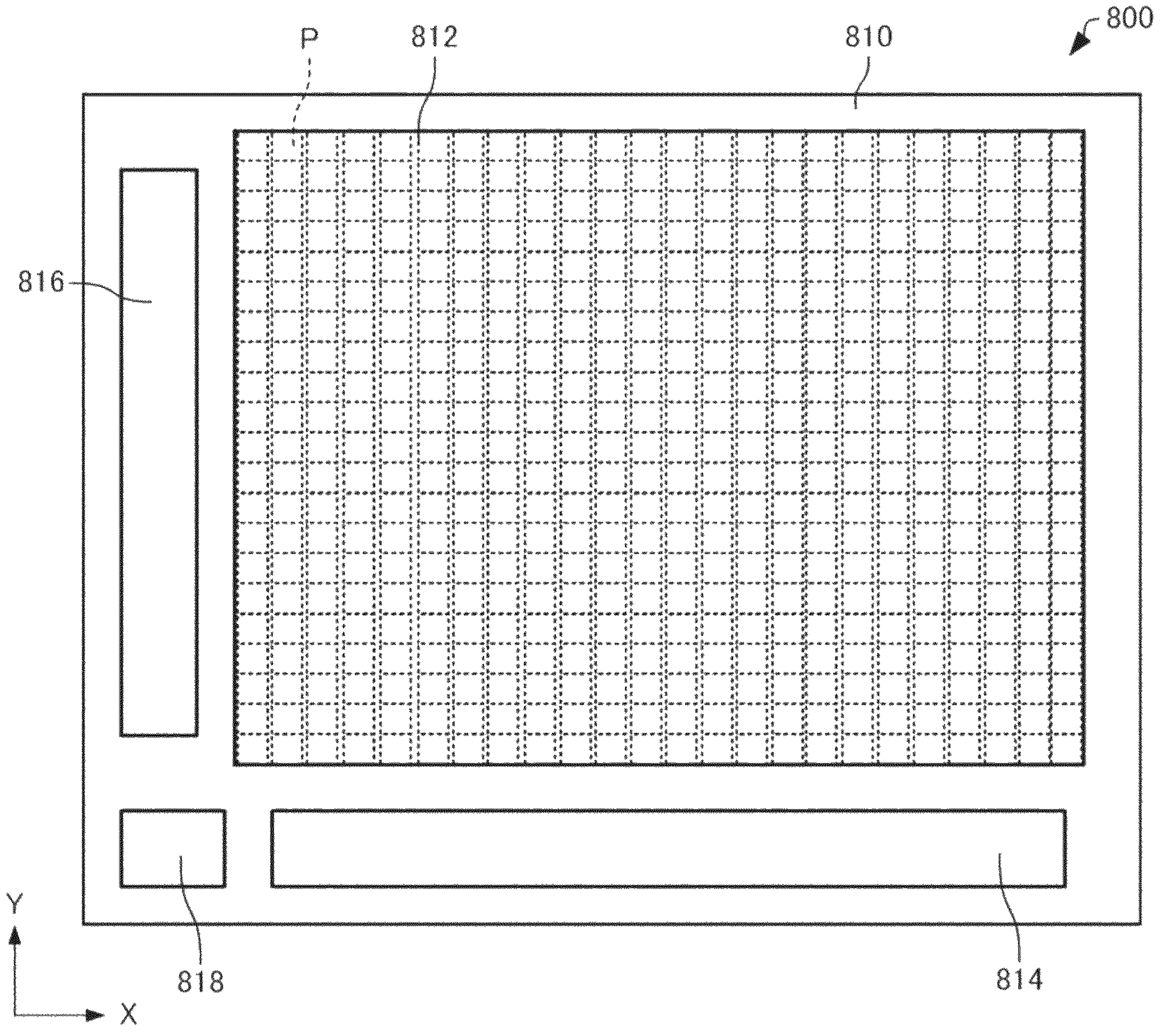
FIG. 16 is a plan view schematically illustrating a display according to the present embodiment.
Figure 17:
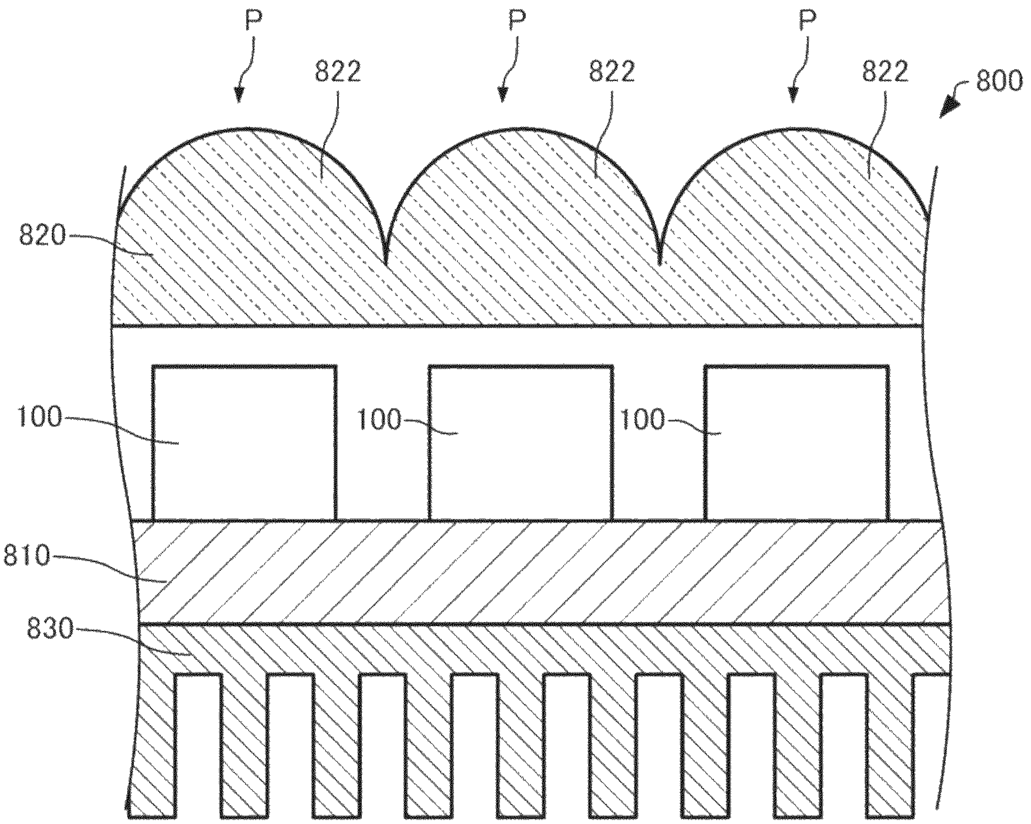
FIG. 17 is a cross-sectional view schematically illustrating the display according to the present embodiment.

Next, a display as a display device according to the present embodiment will be described with reference to the drawings. FIG. 16 is a plan view schematically illustrating a display 800 according to the present embodiment. FIG. 17 is a cross-sectional view schematically illustrating the display 800 according to the present embodiment. Note that an X-axis and a Y-axis are illustrated in FIG. 16 as two axes orthogonal to each other.

The display 800 includes, for example, the light-emitting device 100 as a light source.

The display 800 is a display device that displays an image. The image includes those only displaying character information. The display 800 is a self-luminous display. As illustrated in FIGS. 16 and 17, the display 800 includes, for example, a circuit board 810, a lens array 820, and a heat sink 830.

A driving circuit for driving the light-emitting device 100 is mounted on the circuit board 810. The driving circuit is a circuit including a complementary metal oxide semiconductor (CMOS) and the like for example. The driving circuit drives the light-emitting device 100 based on, for example, input image information. Although not illustrated, a substrate that has a light-transmitting property, for protecting the circuit board 810 is disposed on the circuit board 810.

The circuit board 810 includes, for example, a display region 812, a data line driving circuit 814, a scanning line driving circuit 816, and a control circuit 818.

The display region 812 includes a plurality of pixels P. In the illustrated example, the pixels P are arranged along the X-axis and the Y-axis.

Although not illustrated, the circuit board 810 is provided with a plurality of scanning lines and a plurality of data lines. For example, the scanning lines extend along the X-axis and the data lines extend along the Y-axis. The scanning lines are coupled to the scanning line driving circuit 816. The data lines are coupled to the data line driving circuit 814. In addition, the pixels P are provided to correspond to intersections between the plurality of scanning lines and the plurality of data lines.

The pixels P each include one light-emitting device 100, one lens 822, and a pixel circuit not illustrated, for example. The pixel circuit includes a switching transistor that functions as a switch for the pixel P. The switching transistor has the gate coupled to the scanning line, and has one of the source and the drain coupled to the data line.

The data line driving circuit 814 and the scanning line driving circuit 816 are circuits that control driving of the light-emitting device 100 constituting the pixel P. The control circuit 818 controls display of an image.

Image data is supplied to the control circuit 818 from an upper level circuit. The control circuit 818 supplies various signals based on the image data to the data line driving circuit 814 and the scanning line driving circuit 816.

When the scanning line is selected by activating the scanning signal by the scanning line driving circuit 816, the switching transistor provided in the selected pixel P is turned on. At this time, the data line driving circuit 814 supplies a data signal from the data line to the selected pixel P. As a result, the light-emitting device 100 of the selected pixel P emits light based on the data signal.

The lens array 820 includes a plurality of the lenses 822. For example, one lens 822 is provided for one light-emitting device 100. Light emitted from light-emitting device 100 is incident on one lens 822.

The heat sink 830 is in contact with the circuit board 810. The material of the heat sink 830 is, for example, a metal such as copper or aluminum. The heat sink 830 dissipates heat generated by the light-emitting device 100.

6. HEAD-MOUNTED DISPLAY

6.1. Overall Configuration

Figure 18:
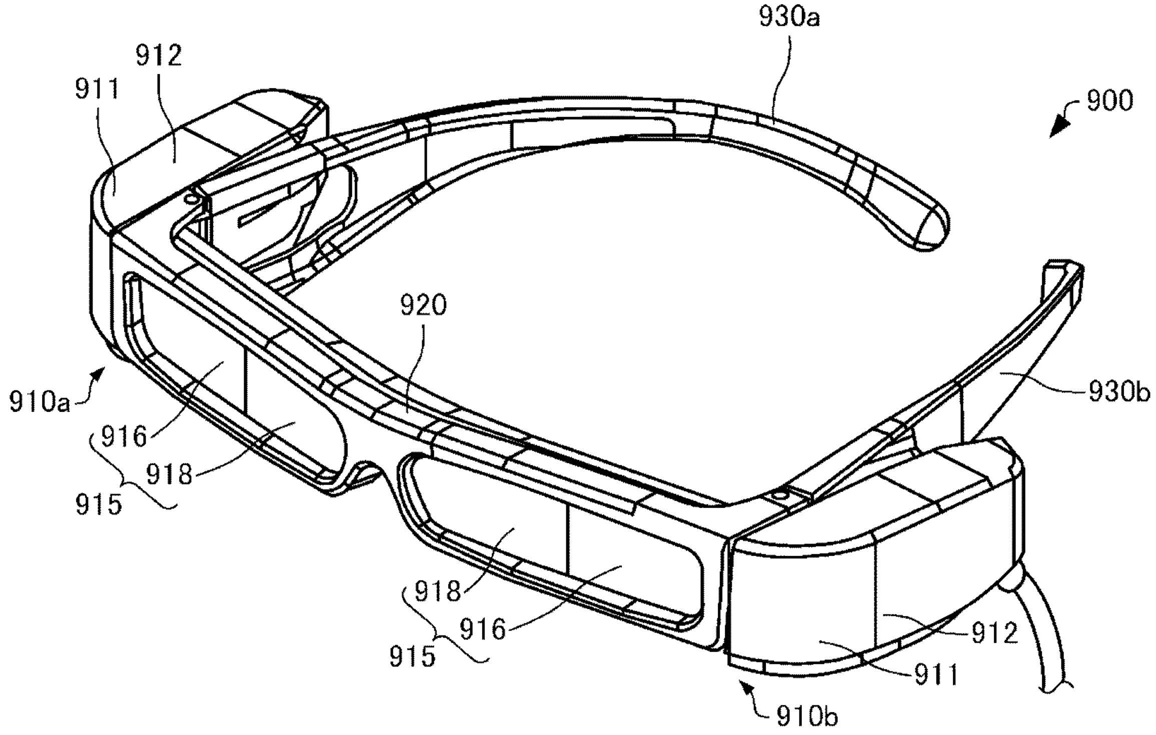
FIG. 18 is a perspective view schematically illustrating a head-mounted display according to the present embodiment.

Next, a head-mounted display being an electronic apparatus according to the present embodiment is described with reference to the accompanying drawings. FIG. 18 is a perspective view schematically illustrating a head-mounted display 900 according to the present embodiment.

As illustrated in FIG. 18, the head-mounted display 900 is a head-mounted device that has an outer appearance of an eyewear. The head-mounted display 900 is mounted on the head of a viewer. The viewer is a user who uses the head-mounted display 900. The head-mounted display 900 allows the viewer to visually recognize image light of a virtual image and to visually recognize an external image in a see-through manner.

The head-mounted display 900 includes a first display unit 910*a*, a second display unit 910*b*, a frame 920, a first temple 930*a*, and a second temple 930*b* for example.

The first display unit 910*a* and the second display unit 910*b* display images. Specifically, the first display unit 910*a* displays a virtual image for the right eye of the viewer. The second display unit 910*b* displays a virtual image for the left eye of the viewer. The display units 910*a* and 910*b* include, for example, an image forming device 911 and a light-guiding device 915.

The image forming device 911 generates image light. The image forming device 911 includes, for example, an optical system such as a light source and a projection device, and an external member 912. The external member 912 houses the light source and the projection device.

The light-guiding device 915 covers the front of the eyes of the viewer. The light-guiding device 915 guides the image light formed by the image forming device 911 and allows the viewer to visually recognize external light and the image light in an overlapping manner. Note that details of the image forming device 911 and the light-guiding device 915 will be described below.

The frame 920 supports the first display unit 910*a* and the second display unit 910*b*. For example, the frame 920 surrounds the display units 910*a* and 910*b*. In the illustrated example, the image forming device 911 of the first display unit 910*a* is attached to one end portion of the frame 920. The image forming device 911 of the second display unit 910*b* is attached to the other end portion of the frame 920.

The first temple 930*a* and the second temple 930*b* extend from the frame 920. In the illustrated example, the first temple 930*a* extends from one end portion of the frame 920. The second temple 930*b* extends from the other end portion of the frame 920.

The first temple 930*a* and the second temple 930*b* are put on the ears of the viewer when the head-mounted display 900 is worn by the viewer. The head of the viewer is positioned between the temples 930*a* and 930*b*.

6.2. Image Forming Device and Light-guiding Device

Figure 19:
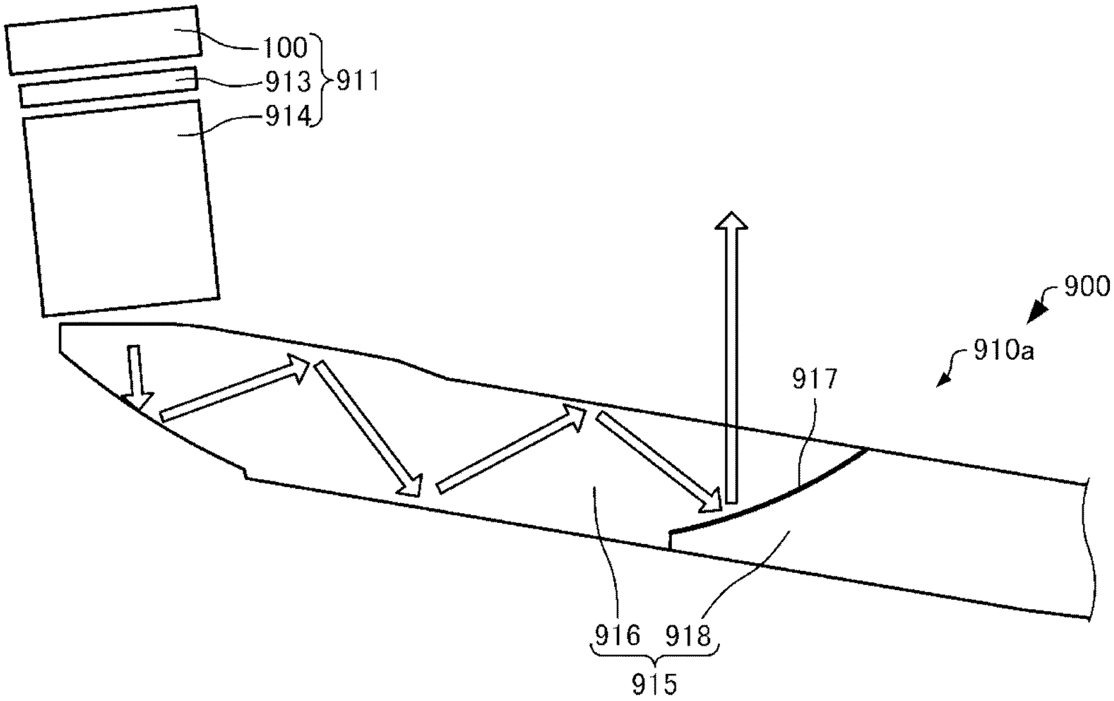
FIG. 19 is a diagram schematically illustrating an image forming device and a light-guiding device of the head-mounted display according to the present embodiment.

FIG. 19 is a diagram schematically illustrating the image forming device 911 and the light-guiding device 915 of the first display unit 910*a* of the head-mounted display 900. Note that the first display unit 910*a* and the second display unit 910*b* have basically the same configuration. Therefore, the following description on the first display unit 910*a* is applied to the second display unit 910*b*.

As illustrated in FIG. 19, the image forming device 911 includes, for example, the light-emitting device 100 as a light source, an optical modulation device 913, and a projection device 914 for image formation.

The optical modulation device 913 modulates the light incident from the light-emitting device 100 based on image information, and emits image light. The optical modulation device 913 is a transmissive liquid crystal light valve. The light-emitting device 100 may be a self-luminous light-emitting device that emits light based on the image information input. In this case, the optical modulation device 913 is not provided.

The projection device 914 projects the image light emitted from the optical modulation device 913 toward the light-guiding device 915. The projection device 914 is, for example, a projection lens. As the lens constituting the projection device 914, a lens having an axially symmetric surface as a lens surface may be used.

The light-guiding device 915 is accurately positioned with respect to the projection device 914 by being screwed to a lens barrel of the projection device 914, for example. The light-guiding device 915 includes, for example, an image light-guiding member 916 that guides the image light and a see-through member 918 for see-through view.

The image light emitted from the projection device 914 is incident on the image light-guiding member 916. The image light-guiding member 916 is a prism that guides the image light toward the eyes of the viewer. The image light incident on the image light-guiding member 916 is repeatedly reflected on the inner surface of the image light-guiding member 916, and then is reflected by a reflective layer 917 to be emitted from the image light-guiding member 916. The image light emitted from the image light-guiding member 916 reaches the eyes of the viewer. The reflective layer 917 is constituted by, for example, metal or a dielectric multilayer film. The reflective layer 917 may be a half mirror.

The see-through member 918 is adjacent to the image light-guiding member 916. The see-through member 918 is fixed to the image light-guiding member 916. The outer surface of the see-through member 918 is continuous with the outer surface of the image light-guiding member 916, for example. The viewer sees the external light through the see-through member 918. The image light-guiding member 916 also has the function of making the viewer see the external light therethrough, in addition to the function of guiding the image light. Note that the head-mounted display 900 may be configured so as not to allow the viewer to see the external light therethrough.

The light-emitting device according to the embodiment described above can be used for devices other than the projector, the display, and the head-mounted display. The light-emitting device according to the above-described embodiment is used for, for example, indoor and outdoor lighting, a laser printer, a scanner, a sensing device using light, an electronic view finder (EVF), a wearable display such as a smart watch, an in-vehicle light, and an in-vehicle head-up display.

The embodiment and modified examples described above are examples and are not intended as limitations. For example, each embodiment and each modified example can also be combined as appropriate.

The present disclosure includes configurations that are substantially identical to the configurations described in the embodiment, for example, configurations with identical functions, methods, and results, or with identical advantages and effects. Also, the present disclosure includes configurations obtained by replacing non-essential portions of the configurations described in the embodiment. In addition, the present disclosure includes configurations having the same operations and effects or can achieve the same advantages as those of the configurations described in the embodiment. Further, the present disclosure includes configurations obtained by adding known techniques to the configurations described in the embodiment.

The following content is derived from the embodiment and modified examples described above.

A light-emitting device according one aspect includes
- a first electrode,
- a second electrode that is disposed to face the first electrode and has a light-transmitting property,
- a stacked body that is provided between the first electrode and the second electrode and includes a tapered portion having a tapered shape having a width increasing from a side of the first electrode toward a side of the second electrode,
- a first low refractive index portion that is provided on a side surface of the tapered portion and has a lower refractive index than the stacked body,
- a second low refractive index portion that is provided on a side of the second electrode opposite to the stacked body and has a lower refractive index than the stacked body, and
- a metal portion provided on a side surface of the second low refractive index portion, wherein
- the stacked body includes
- a first semiconductor layer of a first conductivity type,
- a second semiconductor layer of a second conductivity type different from the first conductivity type that is provided between the first semiconductor layer and the second electrode, and
- a light-emitting layer that is provided between the first semiconductor layer and the second semiconductor layer,
- light generated in the light-emitting layer is emitted from the side of the second electrode, and
- a surface of the second low refractive index portion on side opposite to the second electrode is a lens surface.

With this light-emitting device, light extraction efficiency can be improved.

In the light-emitting device according to one aspect, a perpendicular line of the side surface of the second low refractive index portion may be parallel to a perpendicular line of the side surface of the tapered portion.

With this light-emitting device, light generated in the light-emitting layer can be condensed for example.

In the light-emitting device according to one aspect, the refractive index of the first low refractive index portion may be lower than the refractive index of the second low refractive index portion.

With this light-emitting device, a difference in refractive index between the first light-transmitting portion and the stacked body can be made large.

In the light-emitting device according to one aspect, the refractive index of the second electrode may be lower than the refractive index of the second semiconductor layer.

With this light-emitting device, light extraction efficiency can be further improved.

In the light-emitting device according to one aspect, the refractive index of the second low refractive index portion may be lower than the refractive index of the second electrode.

With this light-emitting device, light extraction efficiency can be further improved.

The light-emitting device according one aspect may further include a light-transmitting layer provided to the lens surface.

With this light-emitting device, the lens surface can be protected by the light-transmitting layer.

In the light-emitting device according to one aspect, the refractive index of the light-transmitting layer may be lower than the refractive index of the second low refractive index portion.

With this light-emitting device, light extraction efficiency can be further improved.

A display device according to one aspect includes the light-emitting device according to one aspect.

An electronic apparatus according to one aspect includes the light-emitting device according to one aspect.

What is claimed is:

1. A light-emitting device comprising:

a first electrode;

a second electrode that is disposed to face the first electrode and has a light-transmitting property;

a stacked body that is provided between the first electrode and the second electrode and includes a tapered portion having a tapered shape having a width increasing from a side of the first electrode toward a side of the second electrode;

a first low refractive index portion that is provided on a side surface of the tapered portion and has a lower refractive index than the stacked body;

a second low refractive index portion that is provided on a side of the second electrode opposite to the stacked body and has a lower refractive index than the stacked body; and a metal portion provided on a side surface of the second low refractive index portion, wherein the stacked body includes a first semiconductor layer of a first conductivity type, a second semiconductor layer of a second conductivity type different from the first conductivity type that is provided between the first semiconductor layer and the second electrode, and a light-emitting layer that is provided between the first semiconductor layer and the second semiconductor layer, light generated in the light-emitting layer is emitted from the side of the second electrode, and a surface of the second low refractive index portion on a side opposite to the second electrode is a lens surface.

2. The light-emitting device according to claim 1, wherein a perpendicular line of the side surface of the second low refractive index portion is parallel to a perpendicular line of the side surface of the tapered portion.

3. The light-emitting device according to claim 1, wherein the refractive index of the first low refractive index portion is lower than the refractive index of the second low refractive index portion.

4. The light-emitting device according to claim 1, wherein a refractive index of the second electrode is lower than a refractive index of the second semiconductor layer.

5. The light-emitting device according to claim 4, wherein a refractive index of the second low refractive index portion is lower than the refractive index of the second electrode.

6. The light-emitting device according to claim 1 further comprising a light-transmitting layer provided to the lens surface.

7. The light-emitting device according to claim 6, wherein a refractive index of the light-transmitting layer is lower than the refractive index of the second low refractive index portion.

8. A display device comprising the light-emitting device according to claim 1.

9. An electronic apparatus comprising the light-emitting device according to claim 1.

* * * * *